United States Patent
Yamazaki et al.

(10) Patent No.: US 11,955,557 B2
(45) Date of Patent: Apr. 9, 2024

(54) SEMICONDUCTOR DEVICE AND MANUFACTURING METHOD THEREOF

(71) Applicant: Semiconductor Energy Laboratory Co., Ltd., Atsugi (JP)

(72) Inventors: Shunpei Yamazaki, Tokyo (JP); Jun Koyama, Kanagawa (JP)

(73) Assignee: Semiconductor Energy Laboratory Co., Ltd., Atsugi (JP)

(*) Notice: Subject to any disclaimer, the term of this patent is extended or adjusted under 35 U.S.C. 154(b) by 0 days.

(21) Appl. No.: 17/899,654

(22) Filed: Aug. 31, 2022

(65) Prior Publication Data

US 2022/0416087 A1    Dec. 29, 2022

Related U.S. Application Data

(63) Continuation of application No. 17/172,261, filed on Feb. 10, 2021, now Pat. No. 11,456,385, which is a (Continued)

(30) Foreign Application Priority Data

Nov. 13, 2009  (JP) .................... 2009-260368

(51) Int. Cl.
*H01L 29/786*     (2006.01)
*H01L 29/04*      (2006.01)
(Continued)

(52) U.S. Cl.
CPC ...... *H01L 29/78618* (2013.01); *H01L 29/045* (2013.01); *H01L 29/24* (2013.01);
(Continued)

(58) Field of Classification Search
CPC .............. H01L 29/78618; H01L 29/45; H01L 29/66757; H01L 29/7869
See application file for complete search history.

(56) References Cited

U.S. PATENT DOCUMENTS

| 5,334,859 A | 8/1994 | Matsuda |
| 5,622,653 A | 4/1997 | Orita et al. |

(Continued)

FOREIGN PATENT DOCUMENTS

| EP | 0530834 A | 3/1993 |
| EP | 0544069 A | 6/1993 |

(Continued)

OTHER PUBLICATIONS

Asakuma.N et al., "Crystallization and Reduction of Sol-Gel-Derived Zinc Oxide Films by Irradiation With Ultraviolet Lamp", Journal of Sol-Gel Science and Technology, 2003, vol. 26, pp. 181-184.

(Continued)

*Primary Examiner* — Phat X Cao
(74) *Attorney, Agent, or Firm* — Fish & Richardson P.C.

(57) ABSTRACT

A semiconductor device includes an oxide semiconductor layer, a source electrode and a drain electrode electrically connected to the oxide semiconductor layer, a gate insulating layer covering the oxide semiconductor layer, the source electrode, and the drain electrode, and a gate electrode over the gate insulating layer. The source electrode and the drain electrode include an oxide region formed by oxidizing a side surface thereof. Note that the oxide region of the source electrode and the drain electrode is preferably formed by plasma treatment with a high frequency power of 300 MHz to 300 GHz and a mixed gas of oxygen and argon.

8 Claims, 16 Drawing Sheets

Related U.S. Application Data continuation of application No. 16/720,151, filed on Dec. 19, 2019, now Pat. No. 10,944,010, which is a continuation of application No. 15/919,437, filed on Mar. 13, 2018, now Pat. No. 10,516,055, which is a continuation of application No. 14/974,627, filed on Dec. 18, 2015, now Pat. No. 10,056,494, which is a continuation of application No. 14/287,320, filed on May 27, 2014, now Pat. No. 9,219,162, which is a continuation of application No. 13/770,022, filed on Feb. 19, 2013, now Pat. No. 8,742,544, which is a continuation of application No. 12/945,243, filed on Nov. 12, 2010, now Pat. No. 8,410,002.

(51) Int. Cl.
  H01L 29/24 (2006.01)
  H01L 29/45 (2006.01)
  H01L 29/66 (2006.01)

(52) U.S. Cl.
  CPC ........ H01L 29/45 (2013.01); H01L 29/66757 (2013.01); H01L 29/66969 (2013.01); H01L 29/7869 (2013.01); H01L 29/78696 (2013.01)

(56) References Cited

U.S. PATENT DOCUMENTS

| | | | |
|---|---|---|---|
| 5,681,671 A | 10/1997 | Orita et al. |
| 5,731,856 A | 3/1998 | Kim et al. |
| 5,744,864 A | 4/1998 | Cillessen et al. |
| 5,843,341 A | 12/1998 | Orita et al. |
| 5,955,178 A | 9/1999 | Orita et al. |
| 6,294,274 B1 | 9/2001 | Kawazoe et al. |
| 6,528,357 B2 | 3/2003 | Dojo et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,189,992 B2 | 3/2007 | Wager, III et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,304,384 B2 | 12/2007 | Koike et al. |
| 7,323,356 B2 | 1/2008 | Hosono et al. |
| 7,339,187 B2 | 3/2008 | Wager, III et al. |
| 7,385,224 B2 | 6/2008 | Ishii et al. |
| 7,399,989 B2 | 7/2008 | Moriya et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,511,343 B2 | 3/2009 | Li et al. |
| 7,576,394 B2 | 8/2009 | Furuta et al. |
| 7,626,665 B2 | 12/2009 | Koike |
| 7,674,650 B2 | 3/2010 | Akimoto et al. |
| 7,732,819 B2 | 6/2010 | Akimoto et al. |
| 7,782,433 B2 | 8/2010 | Koike |
| 7,791,074 B2 | 9/2010 | Iwasaki |
| 7,804,088 B2 | 9/2010 | Tanaka et al. |
| 7,804,091 B2 | 9/2010 | Takechi et al. |
| 7,838,328 B2 | 11/2010 | Isa |
| 7,855,369 B2 | 12/2010 | Takahashi |
| 7,858,971 B2 | 12/2010 | Song et al. |
| 7,884,360 B2 | 2/2011 | Takechi et al. |
| 7,888,207 B2 | 2/2011 | Wager, III et al. |
| 7,893,431 B2 | 2/2011 | Kim et al. |
| 7,893,495 B2 | 2/2011 | Li et al. |
| 7,910,490 B2 | 3/2011 | Akimoto et al. |
| 7,910,920 B2 | 3/2011 | Park et al. |
| 7,932,521 B2 | 4/2011 | Akimoto et al. |
| 7,935,964 B2 | 5/2011 | Kim et al. |
| 7,943,517 B2 | 5/2011 | Koike et al. |
| 7,977,675 B2 | 7/2011 | Kawamura et al. |
| 7,981,734 B2 | 7/2011 | Furuta et al. |
| 7,998,372 B2 | 8/2011 | Yano et al. |
| 8,008,184 B2 | 8/2011 | Matsumoto et al. |
| 8,013,331 B2 | 9/2011 | Wakita |
| 8,063,421 B2 | 11/2011 | Kang et al. |
| 8,084,307 B2 | 12/2011 | Itagaki et al. |
| 8,084,860 B2 | 12/2011 | Koike et al. |
| 8,089,158 B2 | 1/2012 | Koike et al. |
| 8,134,156 B2 | 3/2012 | Akimoto |
| 8,158,464 B2 | 4/2012 | Akimoto |
| 8,168,544 B2 | 5/2012 | Chang |
| 8,178,926 B2 | 5/2012 | Nakayama |
| 8,188,480 B2 | 5/2012 | Itai |
| 8,202,365 B2 | 6/2012 | Umeda et al. |
| 8,207,756 B2 | 6/2012 | Shionoiri et al. |
| 8,232,124 B2 | 7/2012 | Takechi et al. |
| 8,236,635 B2 | 8/2012 | Suzawa et al. |
| 8,242,015 B2 | 8/2012 | Matsumoto et al. |
| 8,242,494 B2 | 8/2012 | Suzawa et al. |
| 8,274,077 B2 | 9/2012 | Akimoto et al. |
| 8,304,765 B2 | 11/2012 | Yamazaki et al. |
| 8,309,961 B2 | 11/2012 | Yamazaki et al. |
| 8,319,215 B2 | 11/2012 | Yamazaki et al. |
| 8,324,018 B2 | 12/2012 | Isa et al. |
| 8,343,799 B2 | 1/2013 | Ito et al. |
| 8,368,079 B2 | 2/2013 | Akimoto |
| 8,410,002 B2 | 4/2013 | Yamazaki et al. |
| 8,415,198 B2 | 4/2013 | Itagaki et al. |
| 8,420,442 B2 | 4/2013 | Takechi et al. |
| 8,421,070 B2 | 4/2013 | Kim et al. |
| 8,461,594 B2 | 6/2013 | Morosawa et al. |
| 8,466,463 B2 | 6/2013 | Akimoto et al. |
| 8,470,650 B2 | 6/2013 | Akimoto et al. |
| 8,525,165 B2 | 9/2013 | Akimoto |
| 8,566,502 B2 | 10/2013 | Vaghani |
| 8,614,442 B2 | 12/2013 | Park et al. |
| 8,629,069 B2 | 1/2014 | Akimoto et al. |
| 8,647,933 B2 | 2/2014 | Yamazaki |
| 8,669,550 B2 | 3/2014 | Akimoto et al. |
| 8,735,882 B2 | 5/2014 | Kim et al. |
| 8,742,418 B2 | 6/2014 | Morosawa et al. |
| 8,742,544 B2 | 6/2014 | Yamazaki et al. |
| 8,785,240 B2 | 7/2014 | Watanabe |
| 8,790,959 B2 | 7/2014 | Akimoto et al. |
| 8,796,069 B2 | 8/2014 | Akimoto et al. |
| 8,889,480 B2 | 11/2014 | Takechi et al. |
| 9,048,832 B2 | 6/2015 | Kozuma et al. |
| 9,099,562 B2 | 8/2015 | Akimoto et al. |
| 9,209,026 B2 | 12/2015 | Takechi et al. |
| 9,219,162 B2 | 12/2015 | Yamazaki et al. |
| 11,456,385 B2 * | 9/2022 | Yamazaki ......... H01L 29/78696 |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |

(56) References Cited

U.S. PATENT DOCUMENTS

| | | |
|---|---|---|
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0072439 A1 | 3/2007 | Akimoto et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0108198 A1 | 5/2008 | Wager, III et al. |
| 2008/0128689 A1* | 6/2008 | Lee ............... H01L 29/7869 257/43 |
| 2008/0129195 A1 | 6/2008 | Ishizaki et al. |
| 2008/0166475 A1 | 7/2008 | Jeong et al. |
| 2008/0166834 A1 | 7/2008 | Kim et al. |
| 2008/0182358 A1 | 7/2008 | Cowdery-Corvan et al. |
| 2008/0203387 A1* | 8/2008 | Kang ............... H01L 29/7869 257/E29.096 |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0277663 A1 | 11/2008 | Kang et al. |
| 2008/0296568 A1 | 12/2008 | Ryu et al. |
| 2008/0308805 A1 | 12/2008 | Akimoto et al. |
| 2008/0315193 A1 | 12/2008 | Kim et al. |
| 2009/0008638 A1 | 1/2009 | Kang et al. |
| 2009/0045397 A1 | 2/2009 | Iwasaki |
| 2009/0068773 A1 | 3/2009 | Lai et al. |
| 2009/0073325 A1 | 3/2009 | Kuwabara et al. |
| 2009/0085094 A1 | 4/2009 | Lee et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0186445 A1 | 7/2009 | Akimoto |
| 2009/0189155 A1 | 7/2009 | Akimoto |
| 2009/0224239 A1* | 9/2009 | Wakita ............... B82Y 10/00 977/773 |
| 2009/0236603 A1 | 9/2009 | Takasawa et al. |
| 2009/0278122 A1 | 11/2009 | Hosono et al. |
| 2009/0280600 A1 | 11/2009 | Hosono et al. |
| 2010/0003783 A1 | 1/2010 | Akimoto |
| 2010/0051949 A1 | 3/2010 | Yamazaki et al. |
| 2010/0065839 A1 | 3/2010 | Yamazaki et al. |
| 2010/0065840 A1 | 3/2010 | Yamazaki et al. |
| 2010/0065844 A1 | 3/2010 | Tokunaga |
| 2010/0072467 A1 | 3/2010 | Yamazaki et al. |
| 2010/0084650 A1 | 4/2010 | Yamazaki et al. |
| 2010/0092800 A1 | 4/2010 | Itagaki et al. |
| 2010/0102312 A1 | 4/2010 | Yamazaki et al. |
| 2010/0105163 A1 | 4/2010 | Ito et al. |
| 2010/0109002 A1 | 5/2010 | Itagaki et al. |
| 2010/0117075 A1 | 5/2010 | Akimoto et al. |
| 2010/0123136 A1 | 5/2010 | Lee et al. |
| 2010/0213460 A1 | 8/2010 | Kondo et al. |
| 2010/0233876 A1 | 9/2010 | Matsumoto et al. |
| 2010/0276689 A1 | 11/2010 | Iwasaki |
| 2010/0279462 A1 | 11/2010 | Iwasaki |
| 2010/0283049 A1 | 11/2010 | Sato et al. |
| 2010/0295042 A1 | 11/2010 | Yano et al. |
| 2010/0301329 A1 | 12/2010 | Asano. et al. |
| 2011/0062433 A1 | 3/2011 | Yamazaki |
| 2011/0062436 A1 | 3/2011 | Yamazaki et al. |
| 2011/0104851 A1 | 5/2011 | Akimoto et al. |
| 2011/0114943 A1 | 5/2011 | Yamazaki et al. |
| 2011/0114945 A1 | 5/2011 | Yamazaki et al. |
| 2011/0117698 A1 | 5/2011 | Suzawa et al. |
| 2011/0121290 A1 | 5/2011 | Akimoto et al. |
| 2011/0260157 A1 | 10/2011 | Yano et al. |
| 2012/0001168 A1 | 1/2012 | Ichijo et al. |
| 2012/0063203 A1 | 3/2012 | Matsuzaki. et al. |
| 2012/0295399 A1 | 11/2012 | Kim et al. |
| 2013/0175524 A1 | 7/2013 | Yamazaki et al. |
| 2015/0340513 A1 | 11/2015 | Akimoto et al. |

FOREIGN PATENT DOCUMENTS

| | | |
|---|---|---|
| EP | 0686982 A | 12/1995 |
| EP | 1508924 A | 2/2005 |
| EP | 1737044 A | 12/2006 |
| EP | 1770788 A | 4/2007 |
| EP | 1879233 A | 1/2008 |
| EP | 1921681 A | 5/2008 |
| EP | 1976018 A | 10/2008 |
| EP | 1995787 A | 11/2008 |
| EP | 1998373 A | 12/2008 |
| EP | 1998374 A | 12/2008 |
| EP | 1998375 A | 12/2008 |
| EP | 2101346 A | 9/2009 |
| EP | 2105967 A | 9/2009 |
| EP | 2226847 A | 9/2010 |
| JP | 60-198861 A | 10/1985 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-165059 A | 6/1993 |
| JP | 05-251705 A | 9/1993 |
| JP | 08-245220 A | 9/1996 |
| JP | 08-264794 A | 10/1996 |
| JP | 11-505377 | 5/1999 |
| JP | 2000-026119 A | 1/2000 |
| JP | 2000-044236 A | 2/2000 |
| JP | 2000-150900 A | 5/2000 |
| JP | 2000-174280 A | 6/2000 |
| JP | 2002-076356 A | 3/2002 |
| JP | 2002-289859 A | 10/2002 |
| JP | 2003-086000 A | 3/2003 |
| JP | 2003-086808 A | 3/2003 |
| JP | 2004-103957 A | 4/2004 |
| JP | 2004-273614 A | 9/2004 |
| JP | 2004-273732 A | 9/2004 |
| JP | 2005-203728 A | 7/2005 |
| JP | 2006-502597 | 1/2006 |
| JP | 2007-073704 A | 3/2007 |
| JP | 2007-096055 A | 4/2007 |
| JP | 2007-103918 A | 4/2007 |
| JP | 2007-123861 A | 5/2007 |
| JP | 2007-220820 A | 8/2007 |
| JP | 2007-281486 A | 10/2007 |
| JP | 2007-311404 A | 11/2007 |
| JP | 2008-022008 A | 1/2008 |
| JP | 2008-040343 A | 2/2008 |
| JP | 2008-042088 A | 2/2008 |
| JP | 2008-053356 A | 3/2008 |
| JP | 2008-098637 A | 4/2008 |
| JP | 2008-130814 A | 6/2008 |
| JP | 2008-535205 | 8/2008 |
| JP | 2008-205469 A | 9/2008 |
| JP | 2008-211144 A | 9/2008 |

(56) References Cited

FOREIGN PATENT DOCUMENTS

| | | | | |
|---|---|---|---|---|
| JP | 2008-270313 A | 11/2008 | | |
| JP | 2008-277665 A | 11/2008 | | |
| JP | 2008-281988 A | 11/2008 | | |
| JP | 2008-282887 A | 11/2008 | | |
| JP | 2009-004787 A | 1/2009 | | |
| JP | 2009-032794 A | 2/2009 | | |
| JP | 2009-076877 A | 4/2009 | | |
| JP | 2009-094535 A | 4/2009 | | |
| JP | 2009-130209 A | 6/2009 | | |
| JP | 2009-141002 A | 6/2009 | | |
| JP | 2009-167087 A | 7/2009 | | |
| JP | 2009-206508 A | 9/2009 | | |
| JP | 2009-212476 A | 9/2009 | | |
| JP | 2009-533884 | 9/2009 | | |
| JP | 2009-224479 A | 10/2009 | | |
| JP | 2009-231613 A | 10/2009 | | |
| JP | 2009-231664 A | 10/2009 | | |
| JP | 2009-253204 A | 10/2009 | | |
| JP | 2009-260002 A | 11/2009 | | |
| JP | 2009-260378 A | 11/2009 | | |
| JP | 2009-267399 A | 11/2009 | | |
| KR | 2008-0070811 A | 7/2008 | | |
| KR | 2008-0079906 A | 9/2008 | | |
| KR | 2008-0106049 A | 12/2008 | | |
| KR | 2009-0103553 A | 10/2009 | | |
| TW | 565719 | 12/2003 | | |
| WO | WO-2004/038757 | 5/2004 | | |
| WO | WO-2004/114391 | 12/2004 | | |
| WO | WO-2007/029844 | 3/2007 | | |
| WO | WO-2007/058231 | 5/2007 | | |
| WO | WO-2007/058329 | 5/2007 | | |
| WO | WO-2007/089048 | 8/2007 | | |
| WO | WO-2007/120010 | 10/2007 | | |
| WO | WO-2007/148601 | 12/2007 | | |
| WO | WO-2008/023553 | 2/2008 | | |
| WO | WO-2008/062720 | 5/2008 | | |
| WO | WO-2008/081805 | 7/2008 | | |
| WO | WO-2008/126879 | 10/2008 | | |
| WO | WO-2008/136505 | 11/2008 | | |
| WO | WO-2008149873 A1 * | 12/2008 | ....... | H01L 29/78618 |
| WO | WO-2009/072532 | 6/2009 | | |
| WO | WO-2009/093625 | 7/2009 | | |
| WO | WO-2009/096608 | 8/2009 | | |
| WO | WO-2010/041686 | 4/2010 | | |

OTHER PUBLICATIONS

Asaoka.Y et al., "29.1:Polarizer-Free Reflective LCD Combined With Ultra Low-Power Driving Technology", SID Digest '09 : SID International Symposium Digest of Technical Papers, May 31, 2009, pp. 395-398.

Chern.H et al., "An Analytical Model for the Above-Threshold Characteristics of Polysilicon Thin-Film Transistors", IEEE Transactions On Electron Devices, Jul. 1, 1995, vol. 42, No. 7, pp. 1240-1246.

Cho.D et al., "21.2:AL and Sn-Doped Zinc Indium Oxide Thin Film Transistors for AMOLED Back-Plane", SID Digest '09 : SID International Symposium Digest of Technical Papers, May 31, 2009, pp. 280-283.

Clark.S et al., "First Principles Methods Using CASTEP", Zeitschrift fur Kristallographie, 2005, vol. 220, pp. 567-570.

Coates.D et al., "Optical Studies of the Amorphous Liquid-Cholesteric Liquid Crystal Transition: the "Blue Phase"", Physics Letters, Sep. 10, 1973, vol. 45A, No. 2, pp. 115-116.

Costello.M et al., "Electron Microscopy of a Cholesteric Liquid Crystal and Its Blue Phase", Phys. Rev. a (Physical Review. A), May 1, 1984, vol. 29, No. 5, pp. 2957-2959.

Dembo.H et al., "RFCPUS on Glass and Plastic Substrates Fabricated By TFT Transfer Technology", IEDM 05: Technical Digest of International Electron Devices Meeting, Dec. 5, 2005, pp. 1067-1069.

Fortunato.E et al., "Wide-Bandgap High-Mobility ZnO Thin-Film Transistors Produced at Room Temperature", Appl. Phys. Lett. (Applied Physics Letters) , Sep. 27, 2004, vol. 85, No. 13, pp. 2541-2543.

Fung.T et al., "2-D Numerical Simulation of High Performance Amorphous In—Ga—Zn—O TFTs for Flat Panel Displays", AM-FPD '08 Digest of Technical Papers, Jul. 2, 2008, pp. 251-252, The Japan Society of Applied Physics.

Godo.H et al., "Temperature Dependence of Characteristics and Electronic Structure for Amorphous In—Ga—Zn-Oxide TFT", AM-FPD '09 Digest of Technical Papers, Jul. 1, 2009, pp. 41-44.

Godo.H et al., "P-9:NUMERICAL Analysis on Temperature Dependence of Characteristics of Amorphous In—Ga—Zn-Oxide TFT", SID Digest '09 : SID International Symposium Digest of Technical Papers, May 31, 2009, pp. 1110-1112.

Hayashi.R et al., "42.1: Invited Paper: Improved Amorphous In—Ga—Zn—O TFTs", SID Digest '08 : SID International Symposium Digest of Technical Papers, May 20, 2008, vol. 39, pp. 621-624.

Hirao.T et al., "Novel Top-Gate Zinc Oxide Thin-Film Transistors (ZnO TFTs) for AMLCDs", J. Soc. Inf. Display (Journal of the Society for Information Display), 2007, vol. 15, No. 1, pp. 17-22.

Hosono.H, "68.3:Invited Paper:Transparent Amorphous Oxide Semiconductors for High Performance TFT", SID Digest '07 : SID International Symposium Digest of Technical Papers, 2007, vol. 38, pp. 1830-1833.

Hosono.H et al., "Working hypothesis to explore novel wide band gap electrically conducting amorphous oxides and examples", J. Non-Cryst. Solids (Journal of Non-Crystalline Solids), 1996, vol. 198-200, pp. 165-169.

Hsieh.H et al., "P-29:Modeling of Amorphous Oxide Semiconductor Thin Film Transistors and Subgap Density of States", SID Digest '08 : SID International Symposium Digest of Technical Papers, May 20, 2008, vol. 39, pp. 1277-1280.

Ikeda.T et al., "Full-Functional System Liquid Crystal Display Using CG-Silicon Technology", SID Digest '04 : SID International Symposium Digest of Technical Papers, 2004, vol. 35, pp. 860-863.

Janotti.A et al., "Oxygen Vacancies in ZnO", Appl. Phys. Lett. (Applied Physics Letters) , 2005, vol. 87, pp. 122102-1-122102-3.

Janotti.A et al., "Native Point Defects in ZnO", Phys. Rev. B (Physical Review. B), Oct. 4, 2007, vol. 76, No. 16, pp. 165202-1-165202-22.

Jeong.J et al., "3.1: Distinguished Paper: 12.1-Inch WXGA AMOLED Display Driven by Indium-Gallium-Zinc Oxide TFTs Array", SID Digest '08 : SID International Symposium Digest of Technical Papers, May 20, 2008, vol. 39, No. 1, pp. 1-4.

Jin.D et al., "65.2: Distinguished Paper: World-Largest (6.5") Flexible Full Color Top Emission AMOLED Display on Plastic Film and Its Bending Properties", SID Digest '09 : SID International Symposium Digest of Technical Papers, May 31, 2009, pp. 983-985.

Kanno.H et al., "White Stacked Electrophosphorecent Organic Light-Emitting Devices Employing MOO3 as a Charge-Generation Layer", Adv. Mater. (Advanced Materials), 2006, vol. 18, No. 3, pp. 339-342.

Kikuchi.H et al., "39.1:Invited Paper:Optically Isotropic Nano-Structured Liquid Crystal Composites for Display Applications", SID Digest '09 : SID International Symposium Digest of Technical Papers, May 31, 2009, pp. 578-581.

Kikuchi.H et al., "62.2:Invited Paper:Fast Electro-Optical Switching in Polymer-Stabilized Liquid Crystalline Blue Phases for Display Application", SID Digest '07 : SID International Symposium Digest of Technical Papers, 2007, vol. 38, pp. 1737-1740.

Kikuchi.H et al., "Polymer-Stabilized Liquid Crystal Blue Phases", Nature Materials, Sep. 2, 2002, vol. 1, pp. 64-68.

Kim.S et al., "High-Performance oxide thin film transistors passivated by various gas plasmas", 214th ECS Meeting, 2008, No. 2317, ECS.

Kimizuka.N et al., "Syntheses and Single-Crystal Data of Homologous Compounds, In2O3(ZnO)m (m=3, 4, and 5), InGaO3(ZnO)3, and Ga2O3(ZnO)m (m= 7, 8, 9, and 16) in the In2O3—ZnGa2O4—ZnO System", Journal of Solid State Chemistry, Apr. 1, 1995, vol. 116, No. 1, pp. 170-178.

Kimizuka.N et al., "SPINEL, YBFE2O4, and YB2FE3O7 Types of Structures for Compounds in the In2O3 and SC2O3-A2O3-BO

(56) References Cited

OTHER PUBLICATIONS

Systems [A; Fe, Ga, or Al; B: Mg, Mn, Fe, Ni, Cu, or Zn] at Temperatures Over 1000° C.", Journal of Solid State Chemistry, 1985, vol. 60, pp. 382-384.

Kitzerow.H et al., "Observation of Blue Phases in Chiral Networks", Liquid Crystals, 1993, vol. 14, No. 3, pp. 911-916.

Kurokawa.Y et al., "UHF RFCPUS on Flexible and Glass Substrates for Secure RFID Systems", Journal of Solid-State Circuits, 2008, vol. 43, No. 1, pp. 292-299.

Lany.S et al., "Dopability, Intrinsic Conductivity, and Nonstoichiometry of Transparent Conducting Oxides", Phys. Rev. Lett. (Physical Review Letters), Jan. 26, 2007, vol. 98, pp. 045501-1-045501-4.

Lee.H et al., "Current Status of, Challenges to, and Perspective View of AM-OLED ", IDW '06 : Proceedings of the 13th International Display Workshops, Dec. 7, 2006, pp. 663-666.

Lee.J et al., "World's Largest (15-Inch) XGA AMLCD Panel Using IGZO Oxide TFT", SID Digest '08 : SID International Symposium Digest of Technical Papers, May 20, 2008, vol. 39, pp. 625-628.

Lee.M et al., "15.4:Excellent Performance of Indium-Oxide-Based Thin-Film Transistors by DC Sputtering", SID Digest '09 : SID International Symposium Digest of Technical Papers, May 31, 2009, pp. 191-193.

Li.C et al., "Modulated Structures of Homologous Compounds $InMO_3(ZnO)_m$ (M=In,Ga; m=Integer) Described by Four-Dimensional Superspace Group", Journal of Solid State Chemistry, 1998, vol. 139, pp. 347-355.

Masuda.S et al., "Transparent thin film transistors using ZnO as an active channel layer and their electrical properties", J. Appl. Phys. (Journal of Applied Physics), Feb. 1, 2003, vol. 93, No. 3, pp. 1624-1630.

Meiboom.S et al., "Theory of the Blue Phase of Cholesteric Liquid Crystals", Phys. Rev. Lett. (Physical Review Letters), May 4, 1981, vol. 46, No. 18, pp. 1216-1219.

Miyasaka.M, "Suftla Flexible Microelectronics on Their Way to Business", SID Digest '07 : SID International Symposium Digest of Technical Papers, 2007, vol. 38, pp. 1673-1676.

Mo.Y et al., "Amorphous Oxide TFT Backplanes for Large Size AMOLED Displays", IDW '08 : Proceedings of the 6th International Display Workshops, Dec. 3, 2008, pp. 581-584.

Nakamura.M, "Synthesis of Homologous Compound with New Long-Period Structure", NIRIM Newsletter, Mar. 1, 1995, vol. 150, pp. 1-4.

Nakamura.M et al., "The phase relations in the $In_2O_3$—$Ga_2ZnO_4$—ZnO system at 1350°C.", Journal of Solid State Chemistry, Aug. 1, 1991, vol. 93, No. 2, pp. 298-315.

Nomura.K et al., "Carrier transport in transparent oxide semiconductor with intrinsic structural randomness probed using single-crystalline $InGaO_3(ZnO)_5$ films", Appl. Phys. Lett. (Applied Physics Letters), Sep. 13, 2004, vol. 85, No. 11, pp. 1993-1995.

Nomura.K et al., "Room-Temperature Fabrication of Transparent Flexible Thin-Film Transistors Using Amorphous Oxide Semiconductors", Nature, Nov. 25, 2004, vol. 432, pp. 488-492.

Nomura.K et al., "Thin-Film Transistor Fabricated in Single-Crystalline Transparent Oxide Semiconductor", Science, May 23, 2003, vol. 300, No. 5623, pp. 1269-1272.

Nomura.K et al., "Amorphous Oxide Semiconductors for High-Performance Flexible Thin-Film Transistors", Jpn. J. Appl. Phys. (Japanese Journal of Applied Physics), 2006, vol. 45, No. 5B, pp. 4303-4308.

Nowatari.H et al., "60.2: Intermediate Connector With Suppressed Voltage Loss for White Tandem OLEDs", SID Digest '09 : SID International Symposium Digest of Technical Papers, May 31, 2009, vol. 40, pp. 899-902.

Oba.F et al., "Defect energetics in ZnO: A hybrid Hartree-Fock density functional study", Phys. Rev. B (Physical Review. B), 2008, vol. 77, pp. 245202-1-245202-6.

Oh.M et al., "Improving the Gate Stability of ZnO Thin-Film Transistors With Aluminum Oxide Dielectric Layers", J. Electrochem. Soc. (Journal of the Electrochemical Society), 2008, vol. 155, No. 12, pp. H1009-H1014.

Ohara.H et al., "21.3:4.0 In. QVGA AMOLED Display Using In—Ga—Zn-Oxide TFTs With a Novel Passivation Layer", SID Digest '09 : SID International Symposium Digest of Technical Papers, May 31, 2009, pp. 284-287.

Ohara.H et al., "Amorphous In—Ga—Zn-Oxide TFTs with Suppressed Variation for 4.0 inch QVGA AMOLED Display", AM-FPD '09 Digest of Technical Papers, Jul. 1, 2009, pp. 227-230, the Japan Society of Applied Physics.

Orita.M et al., "Amorphous transparent conductive oxide $InGaO_3(ZnO)_m$ (m<4):a Zn4s conductor", Philosophical Magazine, 2001, vol. 81, No. 5, pp. 501-515.

Orita.M et al., "Mechanism of Electrical Conductivity of Transparent $InGaZnO_4$", Phys. Rev. B (Physical Review. B), Jan. 15, 2000, vol. 61, No. 3, pp. 1811-1816.

Osada.T et al., "15.2: Development of Driver-Integrated Panel using Amorphous In—Ga—Zn-Oxide TFT", SID Digest '09 : SID International Symposium Digest of Technical Papers, May 31, 2009, vol. 40, pp. 184-187.

Osada.T et al., "Development of Driver-Integrated Panel Using Amorphous In—Ga—Zn-Oxide TFT", AM-FPD '09 Digest of Technical Papers, Jul. 1, 2009, pp. 33-36.

Park.J et al., "Electronic Transport Properties of Amorphous Indium-Gallium-Zinc Oxide Semiconductor Upon Exposure to Water", Appl. Phys. Lett. (Applied Physics Letters), 2008, vol. 92, pp. 072104-1-072104-3.

Park.J et al., "Improvements in the Device Characteristics of Amorphous Indium Gallium Zinc Oxide Thin-Film Transistors by Ar Plasma Treatment", Appl. Phys. Lett. (Applied Physics Letters), Jun. 26, 2007, vol. 90, No. 26, pp. 262106-1-262106-3.

Park.J et al., "Amorphous Indium-Gallium-Zinc Oxide TFTs and Their Application for Large Size AMOLED", AM-FPD '08 Digest of Technical Papers, Jul. 2, 2008, pp. 275-278.

Park.J et al., "High performance amorphous oxide thin film transistors with self-aligned top-gate structure", IEDM 09: Technical Digest of International Electron Devices Meeting, Dec. 7, 2009, pp. 191-194.

Park.J et al., "Dry etching of ZnO films and plasma-induced damage to optical properties", J. Vac. Sci. Technol. B (Journal of Vacuum Science & Technology B), Mar. 1, 2003, vol. 21, No. 2, pp. 800-803.

Park.S et al., "Challenge to Future Displays: Transparent AM-OLED Driven by PEALD Grown ZnO TFT", IMID '07 DIGEST, 2007, pp. 1249-1252.

Park.S et al., "42.3: Transparent ZnO Thin Film Transistor for the Application of High Aperture Ratio Bottom Emission AM-OLED Display", SID Digest '08 : SID International Symposium Digest of Technical Papers, May 20, 2008, vol. 39, pp. 629-632.

Prins.M et al., "A Ferroelectric Transparent Thin-Film Transistor", Appl. Phys. Lett. (Applied Physics Letters), Jun. 17, 1996, vol. 68, No. 25, pp. 3650-3652.

Sakata.J et al., "Development of 4.0-In. AMOLED Display With Driver Circuit Using Amorphous In—Ga—Zn-Oxide TFTs", IDW '09 : Proceedings of the 16th International Display Workshops, 2009, pp. 689-692.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT", SID Digest '08 : SID International Symposium Digest of Technical Papers, May 20, 2008, vol. 39, pp. 633-636.

Takahashi.M et al., "Theoretical Analysis of IGZO Transparent Amorphous Oxide Semiconductor", IDW '08 : Proceedings of the 15th International Display Workshops, Dec. 3, 2008, pp. 1637-1640.

Tsuda.K et al., "Ultra Low Power Consumption Technologies for Mobile TFT-LCDs ", IDW '02 : Proceedings of the 9th International Display Workshops, Dec. 4, 2002, pp. 295-298.

Ueno.K et al., "Field-Effect Transistor on $SrTiO_3$ With Sputtered $Al_2O_3$ Gate Insulator", Appl. Phys. Lett. (Applied Physics Letters), Sep. 1, 2003, vol. 83, No. 9, pp. 1755-1757.

Van de Walle.C, "Hydrogen as a Cause of Doping in Zinc Oxide", Phys. Rev. Lett. (Physical Review Letters), Jul. 31, 2000, vol. 85, No. 5, pp. 1012-1015.

Nakamura.M et al., "Syntheses and crystal structures of new homologous compounds, indium iron zinc oxides ($InFeO_3(ZnO)_m$) (m

(56) References Cited

OTHER PUBLICATIONS natural number) and related compounds", Kotai Butsuri (Solid State Physics), 1993, vol. 28, No. 5, pp. 317-327.
International Search Report (Application No. PCT/JP2010/068795) dated Dec. 7, 2010.
Written Opinion (Application No. PCT/JP2010/068795) dated Dec. 7, 2010.
Korean Office Action (Application No. 2017-7030893) dated Nov. 15, 2017.

* cited by examiner

Energy band diagram of B-B' section ($V_G>0$)

Energy band diagram of B-B' section ($V_G<0$)

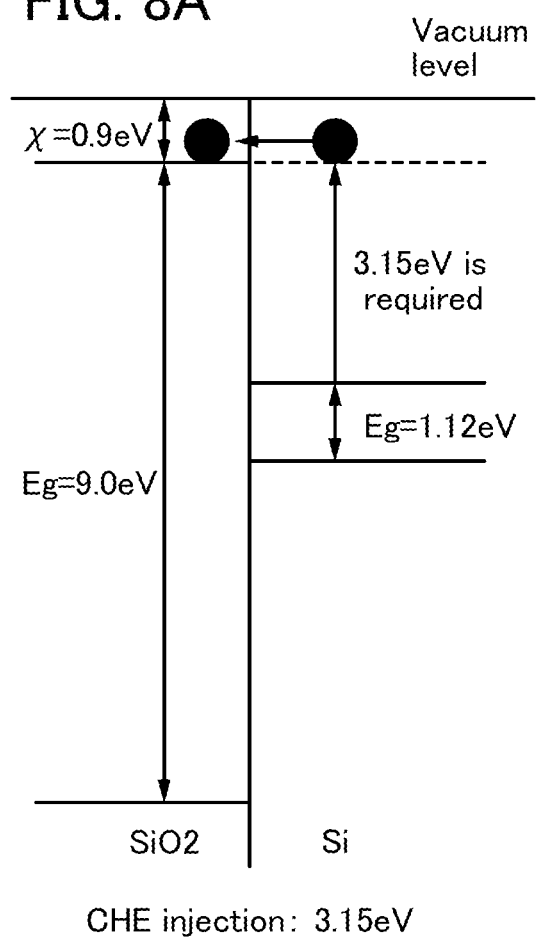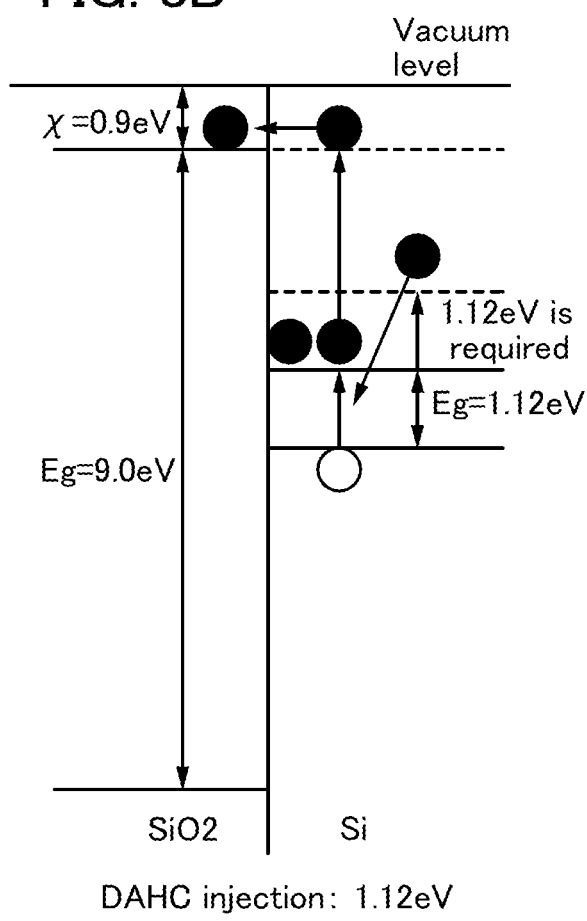
FIG. 8A CHE injection: 3.15eV
FIG. 8B DAHC injection: 1.12eV

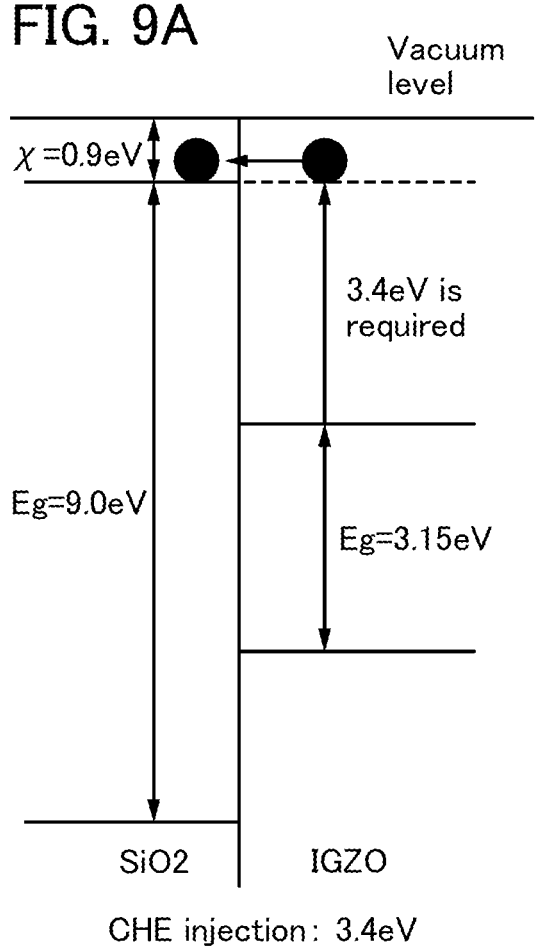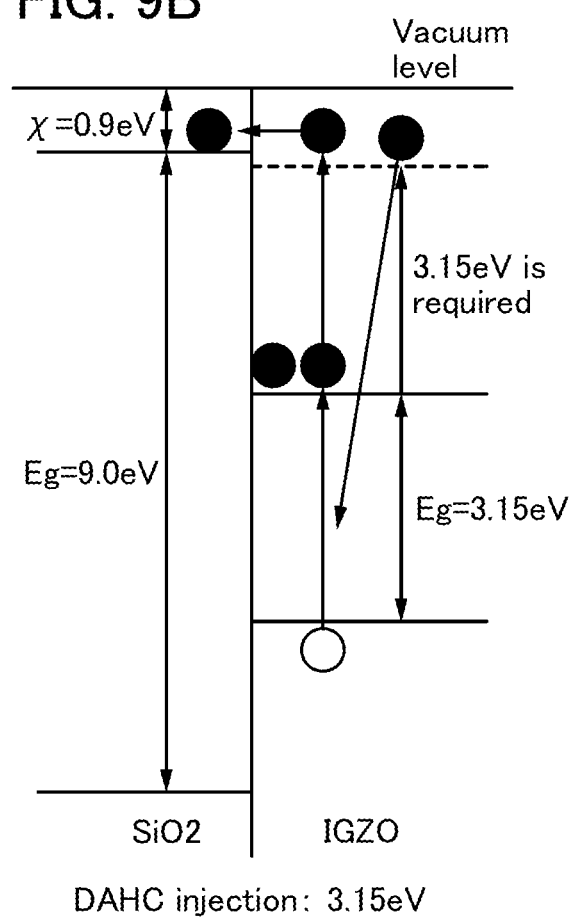

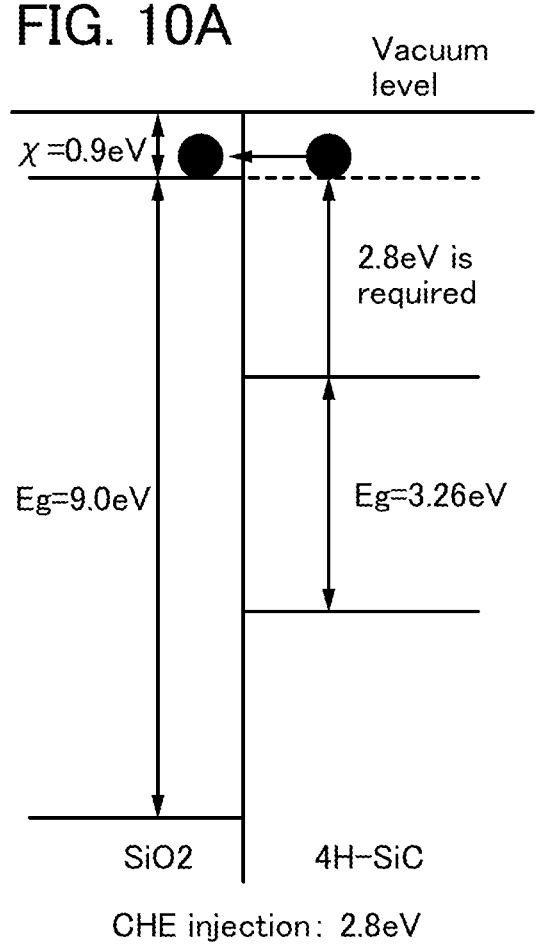
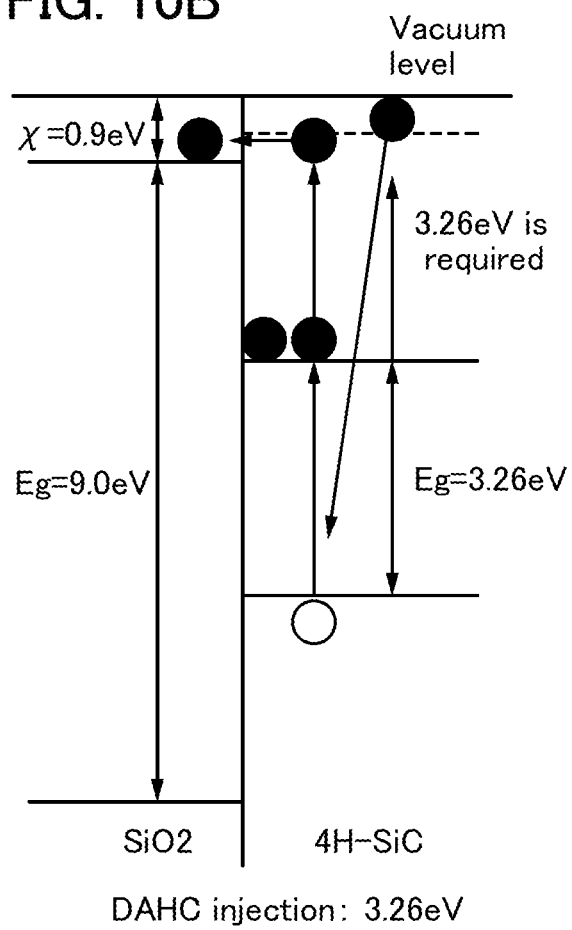

SEMICONDUCTOR DEVICE AND MANUFACTURING METHOD THEREOF

CROSS-REFERENCE TO RELATED APPLICATIONS

This application is a continuation of U.S. application Ser. No. 17/172,261, filed Feb. 10, 2021, now allowed, which is a continuation of U.S. application Ser. No. 16/720,151, filed Dec. 19, 2019, now U.S. Pat. No. 10,944,010, which is a continuation of U.S. Application Ser. No. 15/919.437, filed Mar. 13, 2018, now U.S. Pat. No. 10,516,055, which is a continuation of U.S. application Ser. No. 14/974,627, filed Dec. 18, 2015, now U.S. Pat. No. 10,056,494, which is a continuation of U.S. application Ser. No. 14/287,320, filed May 27, 2014, now U.S. Pat. No. 9,219,162, which is a continuation of U.S. application Ser. No. 13/770,022, filed Feb. 19, 2013, now U.S. Pat. No. 8,742,544, which is a continuation of U.S. application Ser. No. 12/945,243, filed Nov. 12, 2010, now U.S. Pat. No. 8,410,002, which claims the benefit of a foreign priority application filed in Japan as Serial No. 2009-260368 on Nov. 13, 2009, all of which are incorporated by reference.

TECHNICAL FIELD

A technical field of the present invention relates to a semiconductor device and a manufacturing method of the semiconductor device. Note that semiconductor devices herein refer to general elements and devices which function by utilizing semiconductor characteristics.

BACKGROUND ART

There are a wide variety of metal oxides and such material oxides are used for various applications. Indium oxide is a well-known material and is used as a material for transparent electrodes which are needed for liquid crystal display devices or the like.

Some metal oxides have semiconductor characteristics. Examples of such metal oxides having semiconductor characteristics include tungsten oxide, tin oxide, indium oxide, zinc oxide, and the like. A thin film transistor in which a channel formation region is formed using such a metal oxide is already known (see, for example, Patent Documents 1 to 4, Non-Patent Document 1, and the like).

Meanwhile, multi-component oxides are also known as metal oxides. For example, $InGaO_3(ZnO)_m$ (m: natural number) having a homologous phase is known as a multi-component oxide semiconductor including In, Ga, and Zn (see, for example. Non-Patent Documents 2 to 4 and the like).

Furthermore, it is confirmed that an oxide semiconductor including such an In—Ga—Zn— based oxide can also be applied to a channel formation region of a thin film transistor (see, for example, Patent Document 5, Non-Patent Documents 5 and 6, and the like).

REFERENCES

Patent Documents

[Patent Document 1] Japanese Published Patent Application No. S60-198861
[Patent Document 2] Japanese Published Patent Application No. H8-264794
[Patent Document 3] Japanese Translation of PCT International Application No. H11-505377
[Patent Document 4] Japanese Published Patent Application No. 2000-150900
[Patent Document 5] Japanese Published Patent Application No. 2004-103957

Non-Patent Documents

[Non-Patent Document 1] M. W. Prins. K. O. Grosse-Holz, G. Muller, J. F. M. Cillessen, J. B. Giesbers, R. P. Weening, and R. M. Wolf, "A ferroelectric transparent thin-film transistor", *Appl. Phys. Lett.*, 17 Jun. 1996, Vol. 68, pp. 3650-3652
[Non-Patent Document 2] M. Nakamura, N. Kimizuka, and T. Mohri, "The Phase Relations in the $In_2O_3$—$Ga_2ZnO_4$—ZnO System at 1350° C.", *J. Solid State Chem.*, 1991, Vol. 93, pp. 298-315
[Non-Patent Document 3] N. Kimizuka, M. Isobe, and M. Nakamura, "Syntheses and Single-Crystal Data of Homologous Compounds, $In_2O_3(ZnO)_m$ (m=3, 4, and 5), $InGaO_3(ZnO)_3$ and $Ga_2O_3(ZnO)_m$ (m=7, 8, 9, and 16) in the $In_2O_3$—$ZnGa_2O_4$—ZnO System", *J. Solid State Chem.*, 1995, Vol. 116, pp. 170-178
[Non-Patent Document 4] M. Nakamura, N. Kimizuka, T. Mohri, and M. Isobe, "Syntheses and crystal structures of new homologous compounds, indium iron zinc oxides ($InFeO_3(ZnO)_m$) (m: natural number) and related compounds", *KOTAI BUTSURI (SOLID) STATE PHYSICS*), 1993, Vol. 28, No. 5, pp. 317-327
[Non-Patent Document 5] K. Nomura. H. Ohta, K. Ueda. T. Kamiya, M. Hirano, and H. Hosono, "Thin-film transistor fabricated in single-crystalline transparent oxide semiconductor", *SCIENCE,* 2003, Vol. 300, pp. 1269-1272
[Non-Patent Document 6] K. Nomura. H. Ohta, A. Takagi, T. Kamiya, M. Hirano, and H. Hosono, "Room-temperature fabrication of transparent flexible thin-film transistors using amorphous oxide semiconductors", *NATURE,* 2004, Vol. 432, pp. 488-492

DISCLOSURE OF INVENTION

It can hardly be said that a transistor including a conventional oxide semiconductor has characteristics sufficient for practical use, and transistor characteristics such as subthreshold swing (S value), on/off ratio, and reliability need to be improved.

In view of this, it is an object of an embodiment of the disclosed invention to provide a semiconductor device with a novel structure and favorable characteristics.

Alternatively, it is an object to provide a manufacturing method of the semiconductor device with a novel structure.

With respect to a transistor including an oxide semiconductor according to one embodiment of the present invention, which has a source electrode and a drain electrode with an oxidized side surface, characteristics such as subthreshold swing (S value), on/off ratio, and reliability are significantly improved. Specifically, the following structure can be employed, for example.

An embodiment of the present invention is a semiconductor device including an oxide semiconductor layer, a source electrode and a drain electrode electrically connected to the oxide semiconductor layer, a gate insulating layer covering the oxide semiconductor layer, the source electrode, and the drain electrode, and a gate electrode over the gate insulating layer. The source electrode and the drain electrode have an oxide region formed by oxidizing a side surface thereof. Note that the oxide region is formed while oxygen is supplied to the oxide semiconductor layer.

In the above embodiment, it is preferable that the oxide region of the source electrode and the drain electrode be formed by plasma treatment with a high frequency power of 300 MHz to 300 GHz and a mixed gas of oxygen and argon. It is also preferable that a protective insulating layer having substantially the same planar shape as that of the source electrode and the drain electrode be provided over the source electrode and the drain electrode. Note that the expression "substantially the same" or "substantially same" does not necessarily mean being exactly the same in a strict sense and can mean being considered as the same. For example, a difference made by a single etching process is acceptable.

In the above embodiment, it is also preferable that the hydrogen concentration of the oxide semiconductor layer be $5 \times 10^{19}/cm^3$ or less. It is also preferable that the off-state current be $1 \times 10^{-13}$ A or less.

An embodiment of the present invention is a manufacturing method of a semiconductor device, which includes the step of forming an oxide semiconductor layer over a substrate, forming a source electrode and a drain electrode electrically connected to the oxide semiconductor layer, forming a gate insulating layer covering the oxide semiconductor layer, the source electrode, and the drain electrode after oxidizing a side surface of the source electrode and the drain electrode, and forming a gate electrode over the gate insulating layer. Note that oxygen is supplied to the oxide semiconductor layer when the side surface of the source electrode and the drain electrode is oxidized.

In the above embodiment, it is preferable that the side surface of the source electrode and the drain electrode be oxidized by plasma treatment with a high frequency power of 300 MHz to 300 GHz and a mixed gas of oxygen and argon.

In the above embodiment, it is also preferable that a protective insulating layer having substantially the same planar shape as that of the source electrode and the drain electrode be formed over the source electrode and the drain electrode.

In the above embodiment, it is also preferable that the off-state current be made $1 \times 10^{-13}$ A or less by making the hydrogen concentration of the oxide semiconductor layer $5 \times 10^{19}/cm^3$ or less.

Note that the term such as "over" or "below" in this specification and the like does not necessarily mean that a component is placed "directly on" or "directly under" another component. For example, the expression "a first gate electrode over a gate insulating layer" does not exclude the case where a component is placed between the gate insulating layer and the gate electrode. Moreover, the terms such as "over" and "below" are only used for convenience of description and can include the case where the vertical relation of components is reversed, unless otherwise specified.

In addition, the term such as "electrode" or "wiring" in this specification and the like does not limit a function of a component. For example, an "electrode" can be used as part of a "wiring", and the "wiring" can be used as part of the "electrode". Furthermore, the term "electrode" or "wiring" can include the case where a plurality of "electrodes" or "wirings" is formed in an integrated manner.

Functions of a "source" and a "drain" are sometimes interchanged with each other when a transistor of opposite polarity is used or when the direction of current flowing is changed in circuit operation, for example. Therefore, the terms "source" and "drain" can be used to denote the drain and the source, respectively, in this specification.

Note that the term "electrically connected" in this specification and the like includes the case where components are connected through an "object having any electric function". There is no particular limitation on an "object having any electric function" as long as electric signals can be transmitted and received between components that are connected through the object.

Examples of an "object having any electric function" are a switching element such as a transistor, a resistor, an inductor, a capacitor, and an element with a variety of functions as well as an electrode and a wiring.

According to an embodiment of the disclosed invention, characteristics of a transistor including an oxide semiconductor are further improved by supplying oxygen to an oxide semiconductor layer. Here, the oxygen supply process brings the result that a side surface of a source or drain electrode is oxidized in a transistor including an oxide semiconductor.

By oxidizing a side surface of a source or drain electrode, it is possible to prevent short circuit between a gate electrode and the source or drain electrode which may be caused by a reduction in thickness of a gate insulating layer or defective coverage therewith.

By supplying oxygen to an oxide semiconductor layer as described above, a semiconductor device with a novel structure and excellent characteristics can be realized.

BRIEF DESCRIPTION OF DRAWINGS

FIGS. 8A and 8B are diagrams illustrating energy required for hot carrier injection in silicon (Si).

FIGS. 9A and 9B are diagrams illustrating energy required for hot carrier injection in an In—Ga—Zn—O—based oxide semiconductor (IGZO).

FIGS. 10A and 10B are diagrams illustrating energy required for hot carrier injection in silicon carbide (4H—SiC).

BEST MODE FOR CARRYING OUT THE INVENTION

Figure 1:
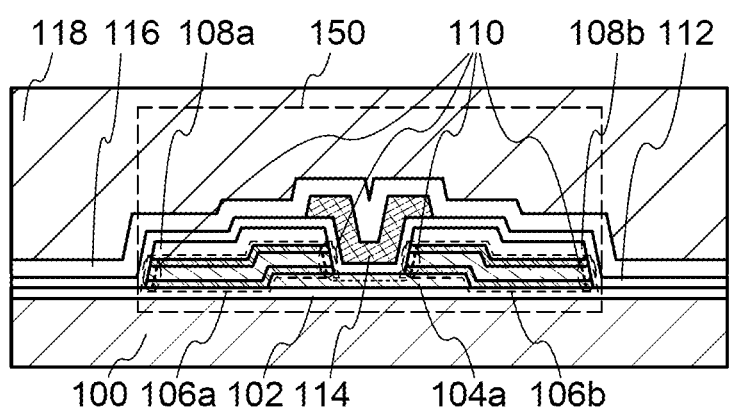
FIG. 1 is a cross-sectional view illustrating a semiconductor device.

Examples of embodiments of the present invention will be described below with reference to the drawings. Note that the present invention is not limited to the following description and it will be readily appreciated by those skilled in the art that the modes and details of the present invention can be modified in various ways without departing from the spirit and the scope thereof. Therefore, the present invention should not be construed as being limited to the description in the following embodiments.

In addition, the position, size, range, or the like of each component illustrated in drawings and the like is not accurately represented in some cases for easy understanding. Therefore, the disclosed invention is not necessarily limited to the position, size, range, or the like as disclosed in the drawings and the like.

Note that ordinal numbers such as "first", "second", and "third" in this specification and the like are used in order to avoid confusion among components, and the terms do not limit the components numerically.

Embodiment 1

In this embodiment, a structure and a manufacturing method of a semiconductor device according to one embodiment of the disclosed invention will be described with reference to FIG. 1, FIGS. 2A to 2D, and FIGS. 3A to 3C.
<Structure of Semiconductor Device>

FIG. 1 is a cross-sectional view illustrating a transistor ISO which is an example of a structure of a semiconductor device. Note that the transistor 150 is an n-channel transistor here; alternatively, a p-channel transistor may be used.

The transistor 150 includes an oxide semiconductor layer 104a provided over a substrate 100 with an the insulating layer 102 interposed therebetween, a source or drain electrode 106a and a source or drain electrode 106b electrically connected to the oxide semiconductor layer 104a, a gate insulating layer 112 covering the source or drain electrode 106a and the source or drain electrode 106b, and a gate electrode 114 over the gate insulating layer 112 (see FIG. 1).

In addition, an interlayer insulating layer 116 and an interlayer insulating layer 118 are provided over the transistor 150.

Here, the source or drain electrode 106a and the source or drain electrode 106b each include an oxide region 110 formed by oxidizing a side surface thereof. With the oxide region 110, it is possible to prevent short circuit between the gate electrode and the source or drain electrode which may be caused by a reduction in thickness of the gate insulating layer or defective coverage therewith.

In addition, the oxide semiconductor layer 104a is preferably an oxide semiconductor layer which is purified by sufficiently removing an impurity such as hydrogen therefrom and supplying oxygen thereto. Specifically, the hydrogen concentration of the oxide semiconductor layer 104a is $5\times10^{19}/cm^3$ or less, preferably $5\times10^{18}/cm^3$ or less, more preferably $5\times10^{17}/cm^3$ or less. Note that the oxide semiconductor layer 104a which is purified by sufficiently reducing hydrogen concentration and supplying oxygen has a carrier concentration (e.g., less than $1\times10^{12}/cm^3$, preferably $1\times10^{11}/cm^3$ or less) which is sufficiently lower than that of a general silicon wafer (a silicon wafer to which an impurity element such as phosphorus or boron is slightly added) (approximately $1\times10^{14}/cm^3$). The transistor 150 with excellent off-state current characteristics can be obtained with the use of such an i-type or substantially i-type oxide semiconductor. For example, when the drain voltage $V_D$ is +1 V or +10 V and the gate voltage $V_G$ is set in the range of from −20 V to −5 V, the off-state current is $1\times10^{-13}$ A or less. Note that the above hydrogen concentration of the oxide semiconductor layer 104a is measured by secondary ion mass spectrometry (SIMS).

Note that an oxide semiconductor included in the oxide semiconductor layer is not particularly limited as long as it has a non-single-crystal structure. A variety of structures, such as an amorphous structure, a microcrystalline (nanocrystalline or the like) structure, a polycrystalline structure, a structure in which microcrystals or polycrystals are included in an amorphous material, or a structure in which microcrystals or polycrystals are formed at a surface of an amorphous structure, can be employed.
<Manufacturing Method of Semiconductor Device>

Next, a manufacturing method of the transistor 150 will be described with reference to FIGS. 2A to 2D and FIGS. 3A to 3C.

First, the insulating layer 102 is formed over the substrate 100. Then, an oxide semiconductor layer 104 is formed over the insulating layer 102 (see FIG. 2A).

The substrate 100 may be any substrate that has an insulating surface and may be, for example, a glass substrate. The glass substrate is preferably a non-alkali glass substrate. As a material of the non-alkali glass substrate, a glass material such as aluminosilicate glass, aluminoborosilicate glass, barium borosilicate glass, or the like is used, for example. Alternatively, as the substrate 100, an insulating substrate formed using an insulator such as a ceramic substrate, a quartz substrate, or a sapphire substrate, a semiconductor substrate which is formed using a semiconductor material such as silicon and whose surface is covered with an insulating material, or a conductive substrate which is formed using a conductor such as metal or stainless steel and whose surface is covered with an insulating material can be used. A plastic substrate can also be used as long as it can withstand heat treatment in a manufacturing process.

The insulating layer 102 functions as a base and can be formed by a CVD method, a sputtering method, or the like. The insulating layer 102 is preferably formed so as to include silicon oxide, silicon nitride, silicon oxynitride, silicon nitride oxide, aluminum oxide, hafnium oxide, tantalum oxide, or the like. Note that the insulating layer 102 may have a single-layer structure or a layered structure. There is no particular limitation on the thickness of the insulating layer 102; the insulating layer 102 can have a thickness of 10 nm to 500 nm, for example. Here, the insulating layer 102 is not an essential component; therefore, a structure in which the insulating layer 102 is not provided is also possible.

If hydrogen, water, or the like is contained in the insulating layer 102, hydrogen may enter the oxide semiconductor layer or extract oxygen from the oxide semiconductor layer, whereby characteristics of the transistor may be degraded. Therefore, it is desirable to form the insulating layer 102 so as to include as little hydrogen or water as possible.

In the case of using a sputtering method or the like, for example, it is desirable that the insulating layer 102 be formed in a state where moisture remaining in the treatment chamber is removed. In order to remove moisture remaining in the treatment chamber, an entrapment vacuum pump such as a cryopump, an ion pump, or a titanium sublimation pump is preferably used. A turbo pump provided with a cold trap may be used. From the treatment chamber evacuated with a cryopump or the like, hydrogen, water, or the like is sufficiently removed; thus, the concentration of an impurity in the insulating layer 102 can be reduced.

When the insulating layer 102 is formed, it is desirable to use a high-purity gas in which an impurity such as hydrogen or water is reduced so that the concentration is decreased to approximately a value expressed in the unit "ppm" (preferably, "ppb").

As the oxide semiconductor layer 104, an oxide semiconductor layer formed using any of the following materials can be applied: four-component metal oxide such as In—Sn—Ga—Zn—O; three-component metal oxide such as In—Ga—Zn—O, In—Sn—Zn—O, In-Al-Zn—O, Sn—Ga—Zn—O, Al—Ga—Zn—O, and Sn—Al—Zn—O; two-component metal oxide such as In—Zn—O, Sn—Zn—O, Al—Zn—O, Zn—Mg—O, Sn—Mg—O, and In—Mg—O; In—O; Sn—O; and Zn—O. In addition, the above oxide semiconductor layer may include $SiO_2$.

As the oxide semiconductor layer 104, a thin film including a material represented by $InMO_3(ZnO)_m$ (m>0) can be used. Here, M represents one or more metal elements selected from Ga, Al, Mn, and Co. For example, M can be Ga, Ga and Al, Ga and Mn, Ga and Co, or the like. An oxide semiconductor material which is represented by $InMO_3(ZnO)_m$ (m>0) and includes Ga as M may be referred to as an In—Ga—Zn—O oxide semiconductor, and a thin film of the In—Ga—Zn—O oxide semiconductor may be referred to as an In—Ga—Zn—O oxide semiconductor film (an In—Ga—Zn—O amorphous film) or the like.

In this embodiment, as the oxide semiconductor layer 104, an amorphous oxide semiconductor layer is formed by a sputtering method using a target for depositing an In—Ga—Zn—O-based oxide semiconductor. Note that since crystallization of an amorphous oxide semiconductor layer can be suppressed by adding silicon to the amorphous oxide semiconductor layer, the oxide semiconductor layer 104 may be formed, for example, using a target including $SiO_2$ of 2 wt % to 10 wt %.

As a target used for forming the oxide semiconductor layer 104 by a sputtering method, a metal oxide target containing zinc oxide as its main component can be used, for example. Moreover, a target for depositing an oxide semiconductor including In, Ga, and Zn (a composition ratio of $In_2O_3:Ga_2O_3:ZnO=1:1:1$ [molar ratio] or In:Ga:Zn=1:1:0.5 [atomic ratio]), or the like can be used, for example. Furthermore, a target for depositing an oxide semiconductor including In, Ga, and Zn (having a composition ratio of In:Ga:Zn 1:1:1 [atomic ratio] or a composition ratio of In:Ga:Zn=1:1:2 [atomic ratio]) may be used. The filling rate of a target for depositing an oxide semiconductor is 90% to 100%, preferably 95% or higher (e.g., 99.9%). The oxide semiconductor layer 104 which is dense is formed using a target for depositing an oxide semiconductor with a high filling rate.

The atmosphere in which the oxide semiconductor layer 104 is formed is preferably a rare gas (typically, argon) atmosphere, an oxygen atmosphere, or a mixed atmosphere of a rare gas (typically, argon) and oxygen. Specifically, it is preferable to use a high-purity gas atmosphere, for example, from which an impurity such as hydrogen, water, a hydroxyl group, or hydride is removed so that the concentration is decreased to approximately a value expressed in the unit "ppm" (preferably, "ppb").

In forming the oxide semiconductor layer 104, the substrate is held in a treatment chamber that is maintained under reduced pressure, and the substrate is heated to a temperature of 100° C. to 600° C., preferably 200° C. to 400° C. Then, a sputtering gas from which hydrogen and water are removed is introduced into the treatment chamber from which remaining moisture is removed, and the oxide semiconductor layer 104 is formed using metal oxide as a target. By forming the oxide semiconductor layer 104 while heating the substrate, the concentration of an impurity in the oxide semiconductor layer 104 can be decreased. Moreover, damage due to sputtering is reduced. In order to remove moisture remaining in the treatment chamber, an entrapment vacuum pump is preferably used. For example, a cryopump, an ion pump, a titanium sublimation pump, or the like can be used. A turbo pump provided with a cold trap may be used. From the treatment chamber evacuated with a cryopump or the like, hydrogen, water, or the like is sufficiently removed; thus, the concentration of an impurity in the oxide semiconductor layer 104 can be reduced.

For example, the conditions for forming the oxide semiconductor layer 104 can be as follows: the distance between the substrate and the target is 100 mm, the pressure is 0.6 Pa, the direct current (DC) power is 0.5 kW, and the atmosphere is an oxygen atmosphere (the proportion of the oxygen flow is 100%). Note that a pulsed direct current (DC) power source is preferably used because powder substances (also referred to as particles or dust) generated in film formation can be reduced and the film thickness can be uniform. The thickness of the oxide semiconductor layer is set in the range of 2 nm to 200 nm, preferably 5 nm to 30 nm. Note that the appropriate thickness of the oxide semiconductor layer 104 differs depending on the oxide semiconductor material to be used, the intended use, or the like; therefore, the thickness may be determined as appropriate in accordance with the material, the intended use, or the like.

Note that before the oxide semiconductor layer 104 is formed by a sputtering method, reverse sputtering in which plasma is generated with an argon gas introduced is preferably performed so that a material attached to the surface of the insulating layer 102 is removed. Here, the reverse sputtering is a method by which ions collide with a surface to be processed so that the surface is modified, in contrast to normal sputtering by which ions collide with a sputtering target. An example of a method for making ions collide with a surface to be processed is a method in which high-frequency voltage is applied to the surface in an argon atmosphere so that plasma is generated near a substrate. Note that an atmosphere of nitrogen, helium, oxygen, or the like may be used instead of an argon atmosphere.

Figure 2A:
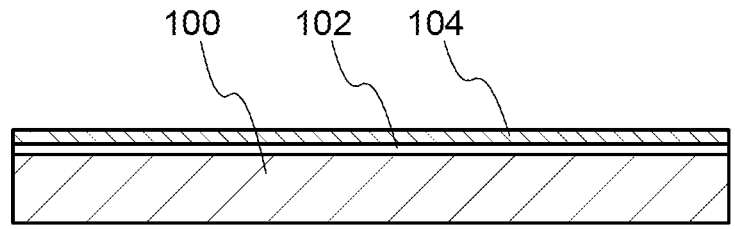
FIGS. 2A to 2D are cross-sectional views illustrating a manufacturing process of a semiconductor device.
Figure 2B:
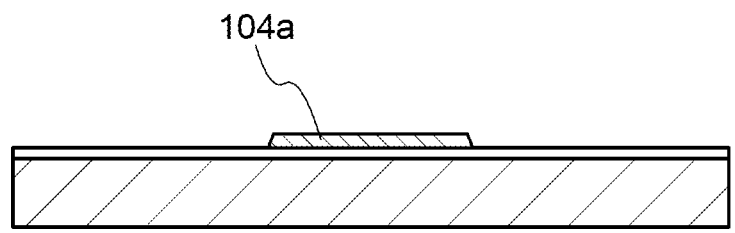

Next, the oxide semiconductor layer 104 is processed by a method such as etching using a mask; thus, the oxide semiconductor layer 104a having an island shape is formed (see FIG. 2B).

As a method for etching the oxide semiconductor layer 104, either dry etching or wet etching may be employed. It is needless to say that dry etching and wet etching can be used in combination. The etching conditions (e.g., an etching gas or an etchant, etching time, and temperature) are set as appropriate depending on the material so that the oxide semiconductor layer 104 can be etched into a desired shape.

As the dry etching method, a parallel plate reactive ion etching (RIE) method, an inductively coupled plasma (ICP) etching method, or the like can be used. Also in this case, etching conditions (e.g., the amount of electric power applied to a coiled electrode, the amount of electric power applied to an electrode on the substrate side, and the electrode temperature on the substrate side) need to be set as appropriate.

An example of an etching gas which can be used for dry etching is a gas containing chlorine (a chlorine-based gas such as chlorine ($Cl_2$), boron chloride ($BCl_3$), silicon tetrachloride ($SiCl_4$), or carbon tetrachloride ($CCl_4$)). Moreover, a gas containing fluorine (a fluorine-based gas such as carbon tetrafluoride ($CF_4$), sulfur fluoride ($SF_6$), nitrogen fluoride ($NF_3$), or trifluoromethane ($CHF_3$)), hydrogen bromide (HBr), oxygen ($O_2$), any of these gases to which a rare gas such as helium (He) or argon (Ar) is added, or the like may be used.

An example of an etchant which can be used for wet etching includes a mixed solution of phosphoric acid, acetic acid, and nitric acid, an ammonia-hydrogen peroxide mixture (hydrogen peroxide solution of 31 wt %: ammonia solution of 28 wt %: water=5:2:2), or the like. An etchant such as ITO-07N (produced by KANTO CHEMICAL CO., INC.) may also be used.

After that, first heat treatment is preferably performed on the oxide semiconductor layer 104a. Water (including a hydroxyl group), hydrogen, or the like contained in the oxide semiconductor layer 104a can be removed by the first heat treatment. The temperature of the first heat treatment is set in the range of 300° C. to 750° C., preferably 400° C. to 700° C. For example, the substrate 100 is introduced into an electric furnace including a resistance heating element or the like, and the oxide semiconductor layer 104a is subjected to heat treatment at 450° C. for one hour in a nitrogen atmosphere. The oxide semiconductor layer 104a is not exposed to the air during the heat treatment so that entry of water or hydrogen can be prevented.

The heat treatment apparatus is not limited to the electric furnace and can be an apparatus for heating an object to be processed by thermal radiation or thermal conduction from a medium such as a heated gas. For example, a rapid thermal annealing (RTA) apparatus such as a gas rapid thermal annealing (GRTA) apparatus or a lamp rapid thermal annealing (LRTA) apparatus can be used. An LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. A GRTA apparatus is an apparatus for performing heat treatment using a high-temperature gas. As the gas, an inert gas that does not react with an object by heat treatment, for example, nitrogen or a rare gas such as argon is used.

For example, as the first heat treatment, a GRTA process may be performed as follows. The substrate is put in an inert gas atmosphere that has been heated to a high temperature of 650° C. to 700° C., heated for several minutes, and taken out of the inert gas atmosphere. The GRTA process enables high-temperature heat treatment in a short time. Moreover, the GRTA process can be employed even when the temperature exceeds the upper temperature limit of the substrate because the heat treatment can be achieved in a short time. In the case where a glass substrate is used, shrinkage of the substrate becomes a problem at a temperature higher than the upper temperature limit (strain point) but does not in the case of performing heat treatment in a short time. Note that the inert gas may be switched to a gas including oxygen during the process. This is because defects caused by oxygen deficiency can be reduced by performing the first heat treatment in an atmosphere including oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is set to 6 N (99.9999%) or more, preferably 7 N (99.99999%) or more (i.e., the impurity concentration is 1 ppm or less, preferably 0.1 ppm or less).

Depending on the conditions of the first heat treatment or the material included in the oxide semiconductor layer, the oxide semiconductor layer is sometimes crystallized to be microcrystalline or polycrystalline. For example, the oxide semiconductor layer sometimes becomes a microcrystalline oxide semiconductor layer having a degree of crystallization of 90% or more, or 80% or more. Further, depending on the conditions of the first heat treatment or the material of the oxide semiconductor layer, the oxide semiconductor layer may be an amorphous oxide semiconductor layer containing no crystalline component.

Furthermore, in the oxide semiconductor layer, microcrystals (the grain size is 1 nm to 20 nm, typically 2 nm to 4 nm) are sometimes mixed in an amorphous oxide semiconductor (e.g., at a surface of the oxide semiconductor layer). The electrical characteristics of the oxide semiconductor layer can also be changed by mixing and aligning microcrystals in an amorphous semiconductor in the above manner.

For example, when the oxide semiconductor layer is formed using a target for depositing an In—Ga—Zn—O— based oxide semiconductor, the electrical characteristics of the oxide semiconductor layer can be changed by formation of a microcrystalline region in which crystal grains of $In_2Ga_2ZnO_7$ with electrical anisotropy are aligned. The microcrystalline region is preferably a region in which the crystal grains are arranged so that the c-axis of $In_2Ga_2ZnO_7$ is perpendicular to a surface of the oxide semiconductor layer, for example. By forming a region in which crystal grains are arranged in such a manner, the conductivity in the direction parallel to the surface of the oxide semiconductor layer can be improved and insulating properties in the direction perpendicular to the surface of the oxide semiconductor layer can be improved. Furthermore, such a microcrystalline region functions to suppress entry of an impurity such as water or hydrogen into the oxide semiconductor layer.

Note that the oxide semiconductor layer including the microcrystalline region can be formed by heating the surface of the oxide semiconductor layer by a GRTA process. Further, the oxide semiconductor layer can be formed in a more preferred manner by using a sputtering target in which the amount of Zn is smaller than that of in or Ga.

The first heat treatment of the oxide semiconductor layer 104a can be performed on the oxide semiconductor layer that has not yet been processed into the oxide semiconductor layer 104a having an island shape. In that case, after the first heat treatment, the substrate 100 is taken out of the heating apparatus and a photolithography step is performed.

Note that the first heat treatment can also be referred to as dehydration treatment, dehydrogenation treatment, or the like. The dehydration treatment or dehydrogenation treatment can be performed after the oxide semiconductor layer is formed and, for example, after a source electrode and a drain electrode are stacked over the oxide semiconductor layer 104a or after a gate insulating layer is formed over the source electrode and the drain electrode. Such dehydration treatment or dehydrogenation treatment may be performed once or plural times.

Figure 3A:
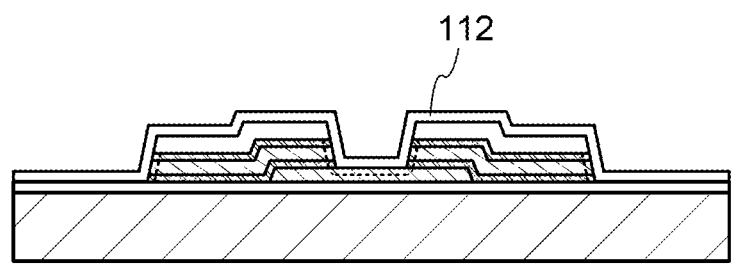
FIGS. 3A to 3C are cross-sectional views illustrating a manufacturing process of a semiconductor device.
Figure 3B:
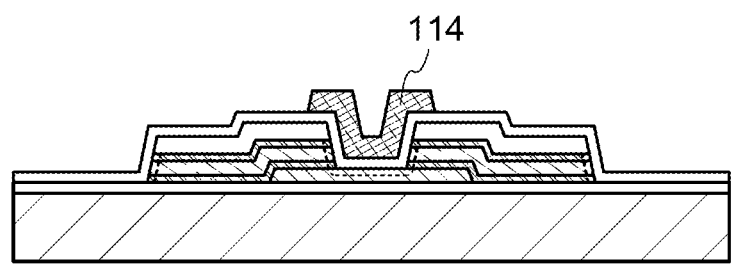
Figure 3C:
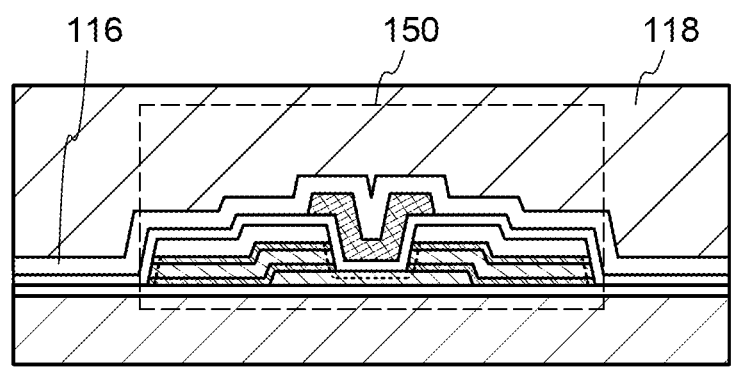

Next, a conductive layer 106 is formed so as to be in contact with the oxide semiconductor layer 104a and then an insulating layer 108 is formed over the conductive layer 106 (see FIG. 3C). Note that the insulating layer 108 is not an essential component but is effective in selectively oxidizing a side surface of a source electrode and a drain electrode to be formed later.

The conductive layer 106 can be formed by a PVD method such as a sputtering method, or a CVD method such as a plasma CVD method. The conductive layer 106 can be formed using an element selected from aluminum, chromium, copper, tantalum, titanium, molybdenum, and tungsten, an alloy including any of these elements as a component, or the like. A material including one or more of manganese, magnesium, zirconium, beryllium, and thorium may be used. A material including aluminum and one or more of elements selected from titanium, tantalum, tungsten, molybdenum, chromium, neodymium, and scandium may be used.

The conductive layer 106 may also be formed using a conductive metal oxide. As the conductive metal oxide, indium oxide ($In_2O_3$), tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials in which silicon or silicon oxide is included can be used.

The conductive layer 106 may have a single-layer structure or a layered structure including two or more layers. For example, the conductive layer 142 may have a single-layer structure of an aluminum film including silicon, a two-layer structure in which a titanium film is stacked over an aluminum film, or a three-layer structure in which a titanium film, an aluminum film, and a titanium film are stacked in this order. Here, a three-layer structure of a titanium film, an aluminum film, and a titanium film is employed.

Note that an oxide conductive layer may be formed between the oxide semiconductor layer 104a and the conductive layer 106. The oxide conductive layer and the conductive layer 106 can be formed successively (successive formation). With such an oxide conductive layer, the resistance of a source region or a drain region can be lowered, which makes it possible to achieve high-speed operation of the transistor.

The insulating layer 108 can be formed by a CVD method, a sputtering method, or the like. The insulating layer 108 is preferably formed so as to include silicon oxide, silicon nitride, silicon oxynitride, silicon nitride oxide, aluminum oxide, hafnium oxide, tantalum oxide, or the like. Note that the insulating layer 108 may have a single-layer structure or a layered structure. There is no particular limitation on the thickness of the insulating layer 108; the insulating layer 108 can have a thickness of 10 nm to 500 nm, for example.

Next, the conductive layer 106 and the insulating layer 108 are selectively etched; thus, the source or drain electrode 106a, the source or drain electrode 106b, an insulating layer 108a, and an insulating layer 108b are formed. Then, oxidation treatment is performed in order to supply oxygen to the oxide semiconductor layer 104a. By the oxidation treatment, the oxide regions 110 are formed in part of the source or drain electrode 106a and the source or drain electrode 106b (see FIG. 2D). In addition, as indicated by a dotted line, a region supplied with oxygen is formed in the oxide semiconductor layer 104a. Note that the range of the region supplied with oxygen changes variously depending on the material included in the oxide semiconductor layer 104a, the conditions of the oxidation treatment, or the like. For example, oxygen can also be supplied to the lower interface of the oxide semiconductor layer 104a.

For light exposure in forming a mask used for etching, ultraviolet light, KrF laser light, or ArF laser light is preferably used. Particularly for light exposure in the case where the channel length (L) is less than 25 nm, light exposure for forming a mask is preferably performed with extreme ultraviolet light whose wavelength is several nanometers to several tens of nanometers, which is extremely short. In light exposure using extreme ultraviolet light, resolution is high and depth of focus is large. Therefore, the channel length of a transistor, which is formed later, can also be 10 nm to 1000 nm. By a decrease in channel length by such a method, operation speed can be improved. In addition, the off-state current of a transistor including the above-described oxide semiconductor is small; thus, an increase in power consumption due to miniaturization can be suppressed.

The materials and etching conditions of the conductive layer 106 and the oxide semiconductor layer 104a are adjusted as appropriate so that the oxide semiconductor layer 104a is not removed in etching of the conductive layer 106. Note that in some cases, the oxide semiconductor layer 104a is partly etched in the etching step and thus has a groove portion (a recessed portion) depending on the materials and the etching conditions.

In order to reduce the number of masks to be used and reduce the number of steps, an etching step may be performed with the use of a resist mask formed using a multi-tone mask which is a light-exposure mask through which light is transmitted to have a plurality of intensities. A resist mask formed with the use of a multi-tone mask has a plurality of thicknesses (has a stair-like shape) and further can be changed in shape by ashing; therefore, the resist mask can be used in a plurality of etching steps. That is, a resist mask corresponding to at least two kinds of different patterns can be formed by using one multi-tone mask. Thus, the number of light-exposure masks can be reduced and the number of corresponding photolithography steps can also be reduced, whereby a process can be simplified.

The oxidation treatment is preferably performed using oxygen plasma excited with a microwave (300 MHz to 300 GHz), which may be referred to as plasma oxidation treatment. The reason is that high-density plasma is realized by plasma excitation with a microwave and damage to the oxide semiconductor layer 104a can be sufficiently reduced.

Specifically, the above treatment can be performed, for example, at a frequency of 300 MHz to 300 GHz (typically, 2.45 GHz) under a pressure of 50 Pa to 5000 Pa (typically, 500 Pa) at a substrate temperature of 200° C. to 400° C. (typically, 300° C.) with the use of a mixed gas of oxygen and argon.

By the above oxidation treatment, oxygen is supplied to the oxide semiconductor layer 104a. Therefore, damage to the oxide semiconductor layer 104a can be sufficiently reduced, and in addition, localized states due to oxygen deficiency can be reduced. In other words, characteristics of the oxide semiconductor layer 104a can be further improved.

Note that without limitation to the plasma oxidation treatment with a microwave, any other method that enables a sufficient reduction in damage to the oxide semiconductor layer 104a and a supply of oxygen to the oxide semiconductor layer 104a can be used. For example, a method such as heat treatment in an atmosphere including oxygen can be used.

In combination with the oxidation treatment, treatment for removing water, hydrogen, or the like from the oxide semiconductor layer 104a may be performed. For example, plasma treatment using a gas such as nitrogen or argon can be performed.

Note that by the oxidation treatment, the oxide regions 110 are formed in part of the source or drain electrode 106a and the source or drain electrode 106b (particularly, portions corresponding to side surfaces thereof). The oxide regions 110 are effective particularly when the transistor 150 is miniaturized (for example, when the channel length is shorter than 1000 nm). With the miniaturization of the transistor, the gate insulating layer needs to have a smaller thickness. The reason why the oxide regions 110 are provided is that the oxide regions 110 can prevent short circuit between the gate electrode and the source or drain electrodes, which may be caused by a reduction in thickness of the gate insulating layer or defective coverage therewith. Note that the oxide regions 110 are sufficiently effective when having a thickness of 5 nm or more (preferably, 10 nm or more).

The oxidation treatment is also effective in terms of improvement in film quality of an exposed portion of the insulating layer 102.

Note that the insulating layer 108a and the insulating layer 108b are important in that these insulating layers function to prevent oxidation of upper portions of the source or drain electrode 106a and the source or drain electrode 106b. This is because it is significantly difficult to perform the plasma treatment while the mask used for etching remains.

Figure 2C:
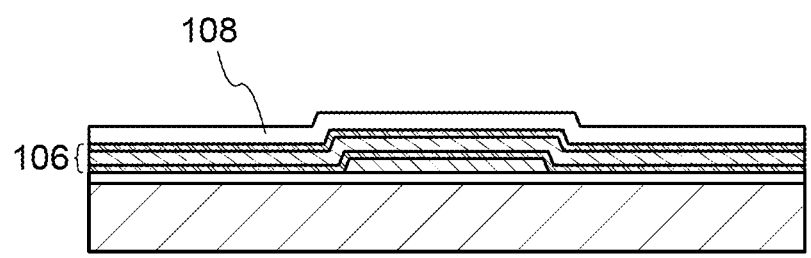
Figure 2D:
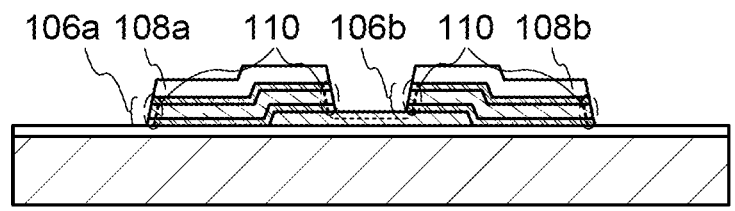

Although FIG. 2D illustrates the case where the source or drain electrode 106a, the source or drain electrode 106b, the insulating layer 108a, and the insulating layer 108b are formed at a time by selectively etching the conductive layer 106 and the insulating layer 108 illustrated in FIG. 2C, an embodiment of the disclosed invention is not limited to this example.

For example, the source or drain electrode 106a, the source or drain electrode 106b, the insulating layer 108a, and the insulating layer 108b may be completed as follows: an opening that reaches the channel formation region of the transistor is formed by selective etching of only a region of the conductive layer 106 and the insulating layer 108 which overlaps the oxide semiconductor layer 104a; then, the region is subjected to the plasma treatment so that oxygen is supplied to the oxide semiconductor layer 104a and the exposed portion of the conductive layer 106 is oxidized; then, etching is performed again. In the case of employing such steps, oxidation treatment can be performed on only an intended portion. Therefore, there is an advantage that the other portion can be prevented from being adversely affected by the oxidation treatment.

Next, the gate insulating layer 112 is formed in contact with part of the oxide semiconductor layer 104a without exposure to the air (see FIG. 3A). The gate insulating layer 112 can be formed by a CVD method, a sputtering method, or the like. The gate insulating layer 112 is preferably formed so as to include silicon oxide, silicon nitride, silicon oxynitride, silicon nitride oxide, aluminum oxide, hafnium oxide, tantalum oxide, or the like. Note that the gate insulating layer 112 may have a single-layer structure or a layered structure. There is no particular limitation on the thickness of the gate insulating layer 112: the gate insulating layer 112 can have a thickness of 10 nm to 500 nm, for example.

Note that an i-type or substantially i-type oxide semiconductor obtained by removing an impurity (a purified oxide semiconductor) is highly susceptible to interface states or interface charges: therefore, the gate insulating layer 112 needs to have high quality.

For example, a high-density plasma CVD method using a microwave (e.g., 2.45 GHz) is favorable in that the gate insulating layer 112 can be dense and have high withstand voltage and high quality. This is because a close contact between a purified oxide semiconductor layer and a high-quality gate insulating layer reduces interface states and produces desirable interface characteristics.

It is needless to say that another method such as a sputtering method or a plasma CVD method can also be employed as long as a high-quality insulating layer can be formed as the gate insulating layer 112. Moreover, it is possible to use an insulating layer whose quality, interface characteristics, or the like is improved with heat treatment performed after the formation of the insulating layer. In any case, an insulating layer that has a reduced interface state density and can form a favorable interface with an oxide semiconductor layer, as well as having favorable film quality as the gate insulating layer 112, is formed.

By thus improving characteristics of the interface with a gate insulating layer and eliminating an impurity, particularly hydrogen, water, or the like, from an oxide semiconductor, it is possible to obtain a stable transistor whose threshold voltage ($V_{th}$) does not change with a gate bias-temperature stress test (BT test, e.g., at 85° C. and $2 \times 10^6$ V/cm for 12 hours).

After that, second heat treatment is performed in an inert gas atmosphere or an oxygen atmosphere. The temperature of the heat treatment is set in the range of 200° C. to 400° C., preferably 250° C. to 350° C. For example, the heat treatment may be performed at 250° C. for 1 hour in a nitrogen atmosphere. The second heat treatment can reduce variation in electric characteristics of the transistor. Note that the second heat treatment is performed in this embodiment after the gate insulating layer 112 is formed; there is no particular limitation on the timing of the second heat treatment as long as it is performed after the first heat treatment.

Next, the gate electrode 114 is formed over the gate insulating layer 112 in a region overlapping the oxide semiconductor layer 104a (see FIG. 3B). The gate electrode 114 can be formed by forming a conductive layer over the gate insulating layer 112 and then selectively patterning the conductive layer.

The conductive layer can be formed by a PVD method such as a sputtering method, or a CVD method such as a plasma CVD method. The conductive layer can be formed using an element selected from aluminum, chromium, copper, tantalum, titanium, molybdenum, and tungsten, an alloy including any of these elements as a component, or the like. A material including one or more of manganese, magnesium, zirconium, beryllium, and thorium may be used. A material including aluminum and one or more of elements selected from titanium, tantalum, tungsten, molybdenum, chromium, neodymium, and scandium may be used.

The conductive layer may also be formed using a conductive metal oxide. As the conductive metal oxide, indium oxide ($In_2O_3$) tin oxide ($SnO_2$), zinc oxide (ZnO), an indium oxide-tin oxide alloy ($In_2O_3$—$SnO_2$, which is abbreviated to ITO in some cases), an indium oxide-zinc oxide alloy ($In_2O_3$—ZnO), or any of these metal oxide materials in which silicon or silicon oxide is included can be used.

The conductive layer may have a single-layer structure or a layered structure including two or more layers. For example, the conductive layer may have a single-layer structure of an aluminum film including silicon, a two-layer structure in which a titanium film is stacked over an aluminum film, or a three-layer structure in which a titanium film, an aluminum film, and a titanium film are stacked in this order. Here, the conductive layer is formed using a material including titanium and then processed into the gate electrode 114.

Next, the interlayer insulating layer 116 and the interlayer insulating layer 118 are formed over the gate insulating layer 112 and the gate electrode 114 (see FIG. 3C). The interlayer insulating layers 116 and 118 can be formed by a PVD method, a CVD method, or the like. The interlayer insulating layers 116 and 118 can be formed using a material including an inorganic insulating material such as silicon oxide, silicon nitride oxide, silicon nitride, hafnium oxide, aluminum oxide, or tantalum oxide. Note that a layered structure of the interlayer insulating layers 116 and 118 is used in this embodiment, but an embodiment of the disclosed invention is not limited to this example. A single-layer structure or a layered structure including three or more layers can also be used.

Note that the interlayer insulating layer 118 is desirably formed so as to have a flat surface. This is because an electrode, a wiring, or the like can be favorably formed over the interlayer insulating layer 118 when the interlayer insulating layer 118 is formed so as to have a flat surface.

Through the above steps, the transistor 150 including an oxide semiconductor is completed.

In the case where the transistor 150 is formed by the above-described method, the hydrogen concentration of the oxide semiconductor layer 104a is $5 \times 10^{19}/cm^3$ or less and the off-state current of the transistor 162 is $1 \times 10^{-13}$ A or less. The transistor 150 with excellent characteristics can be obtained by the application of the oxide semiconductor layer 104a that is purified by a sufficient reduction in hydrogen concentration and by a supply of oxygen as described above. Note that it is preferable that oxygen be supplied shortly after the hydrogen concentration is reduced because there is no possibility that hydrogen, water, or the like enters the oxide semiconductor layer and thus an oxide semiconductor layer with extremely favorable characteristics can be realized. It is needless to say that a treatment for reducing the hydrogen concentration and a treatment for supplying oxygen do not need to be performed successively as long as an oxide semiconductor layer with favorable characteristics can be realized. For example, another treatment may be performed between these treatments. Alternatively, these treatments may be performed at the same time.

In this embodiment, oxygen plasma treatment is performed on the oxide semiconductor layer 104a in order to supply oxygen to the oxide semiconductor layer 104a. Accordingly, the transistor 150 has better characteristics. In addition, a region corresponding to a side surface of the source or drain electrode is oxidized; thus, short circuit between the gate electrode and the source electrode (or the drain electrode), which may be caused by a reduction in thickness of the gate insulating layer, can be prevented.

Note that considerable research has been done on properties of oxide semiconductors; however, the research does not include the idea of sufficiently reducing localized states themselves. According to an embodiment of the disclosed invention, a purified oxide semiconductor is manufactured by removing water and hydrogen, which might be a cause of localized states, from the oxide semiconductor. This is based on the idea of sufficiently reducing localized states themselves. Thus, excellent industrial products can be manufactured.

Note that oxygen may be removed while hydrogen, water, or the like is being removed. Therefore, it is preferable to realize a purified (i-type) oxide semiconductor in such a manner that oxygen is supplied to metal dangling bonds generated by oxygen deficiency so that the localized states due to oxygen deficiency are reduced. For example, an oxygen-excess oxide film is formed in close contact with a channel formation region and heat treatment is performed at a temperature of 200° C. to 400° C., typically 250° C., whereby oxygen can be supplied from the oxide film and the localized states due to oxygen deficiency can be reduced. An inert gas may be switched to a gas including oxygen during the second heat treatment. Further, after the second heat treatment, oxygen can be supplied to the oxide semiconductor through a temperature decreasing process in an oxygen atmosphere or an atmosphere in which hydrogen, water, or the like is sufficiently reduced.

It can be considered that a factor causing deterioration of characteristics of an oxide semiconductor is a shallow level due to excess hydrogen at 0.1 eV to 0.2 eV below the conduction band, a deep level due to oxygen deficiency, or the like. The technical idea that hydrogen is thoroughly eliminated and oxygen is adequately supplied in order to eliminate such a defect would be right.

An oxide semiconductor is generally considered as an n-type semiconductor; however, according to an embodiment of the disclosed invention, an i-type oxide semiconductor is realized by removing an impurity such as water or hydrogen and supplying oxygen which is a constituent element of the oxide semiconductor. In this respect, it can be said that an embodiment of the disclosed invention includes a novel technical idea because it is not an i-type semiconductor such as silicon which is obtained by adding an impurity.

<Electrical Conduction Mechanism of Transistor Including Oxide Semiconductor>

An electrical conduction mechanism of a transistor including an oxide semiconductor will be described with reference to FIG. 4, FIG. 5, FIGS. 6A and 6B, and FIG. 7. Note that the following description is based on the assumption of an ideal situation for easy understanding and does not necessarily reflect a real situation. Note also that the following description is just a consideration and does not affect the validity of the invention.

Figure 4:
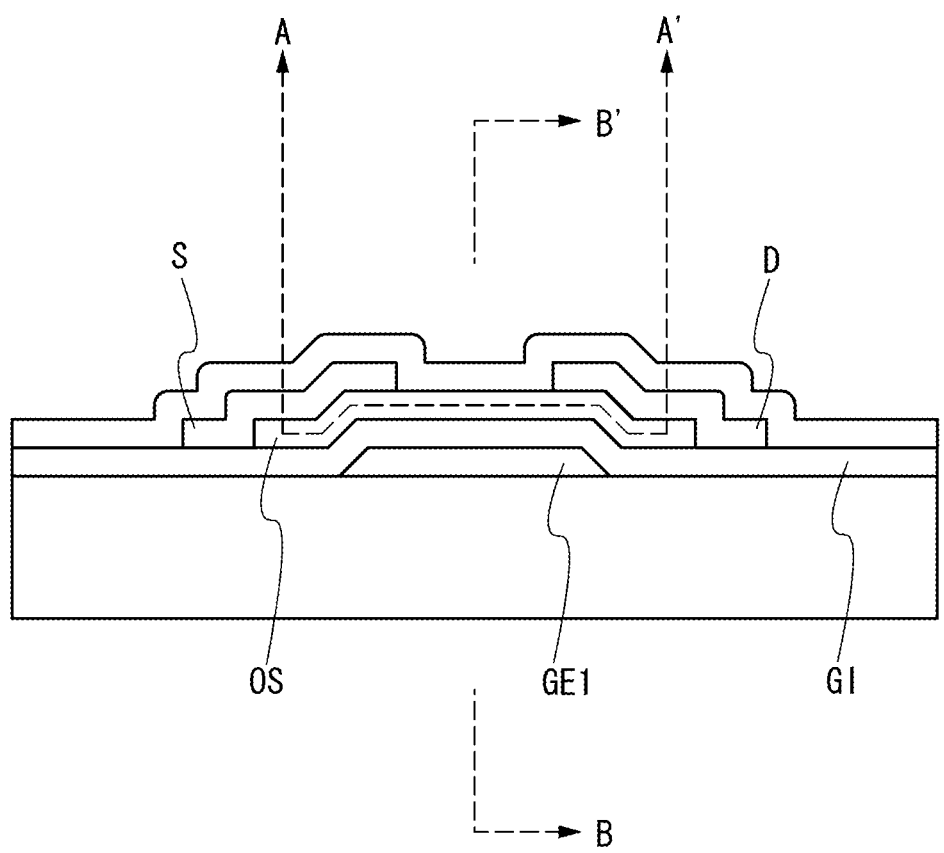
FIG. 4 is a cross-sectional view of a transistor including an oxide semiconductor.

FIG. 4 is a cross-sectional view of a transistor (thin film transistor) including an oxide semiconductor. An oxide semiconductor layer (OS) is provided over a gate electrode (GE1) with a gate insulating layer (GI) interposed therebetween, and a source electrode (S) and a drain electrode (D) are provided thereover. An insulating layer is provided so as to cover the source electrode (S) and the drain electrode (D).

Figure 5:
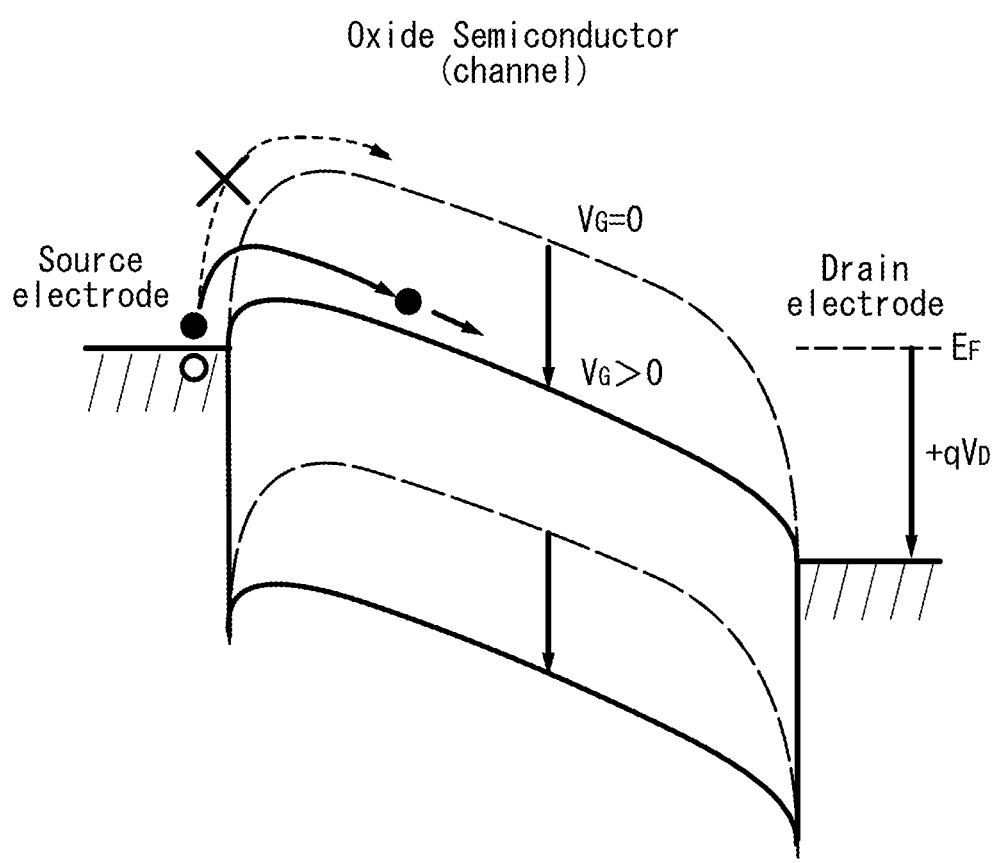
FIG. 5 is an energy band diagram (schematic diagram) along an A-A' section in FIG. 4.

FIG. 5 is an energy band diagram (schematic diagram) of the A-A' section in FIG. 4. In FIG. 5, a black circle (●) and a white circle (○) represent an electron and a hole and have electric charges (−q, +q), respectively. With a positive voltage ($V_D > 0$) applied to the drain electrode, the dashed line shows the case where no voltage is applied to the gate electrode ($V_G = 0$) and the solid line shows the case where a positive voltage is applied to the gate electrode ($V_G > 0$). In the case where no voltage is applied to the gate electrode, carriers (electrons) are not injected to the oxide semiconductor side from an electrode because of high potential barrier, so that a current does not flow, which means an off state. On the other hand, when a positive voltage is applied to the gate electrode, potential barrier is lowered, and thus a current flows, which means an on state.

Figure 6A:
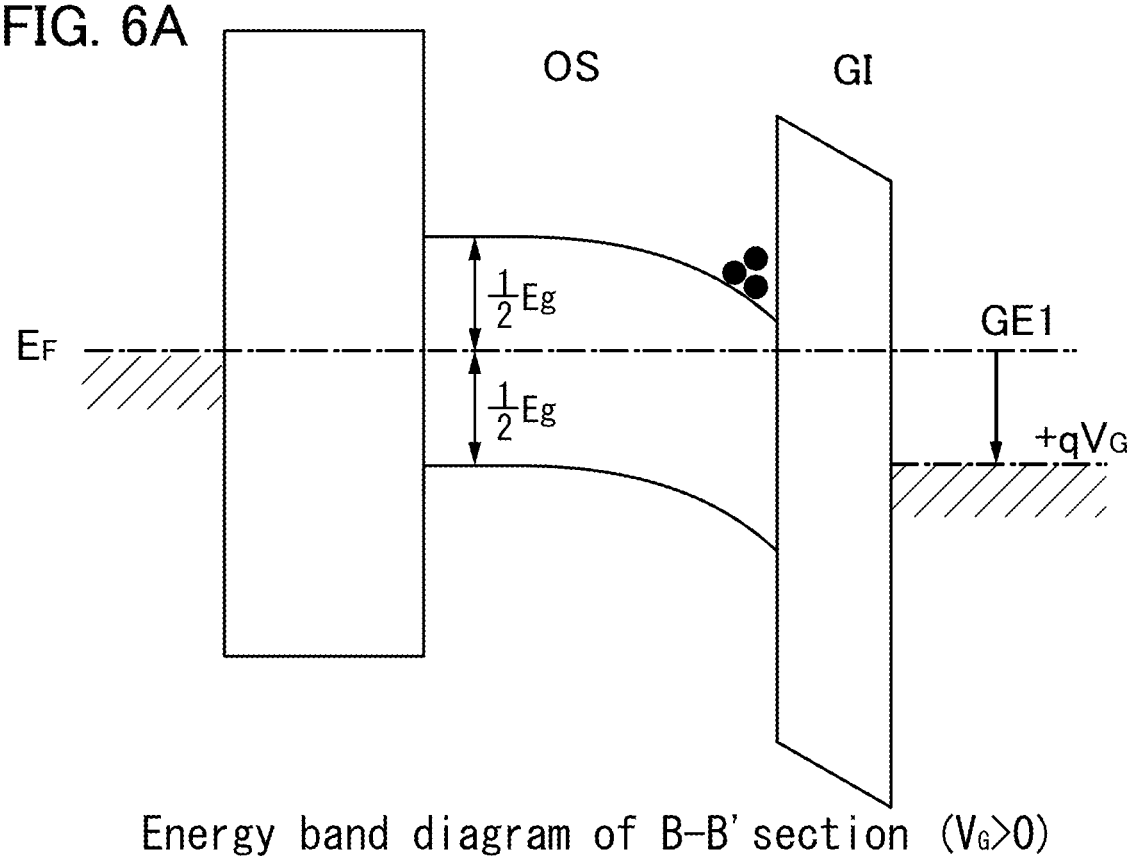
FIG. 6A is a diagram illustrating a state where a positive voltage ($V_G>0$) is applied to a gate (GE1) and FIG. 6B is a diagram illustrating a state where a negative voltage ($V_G<0$) is applied to the gate (GE1).
Figure 6B:
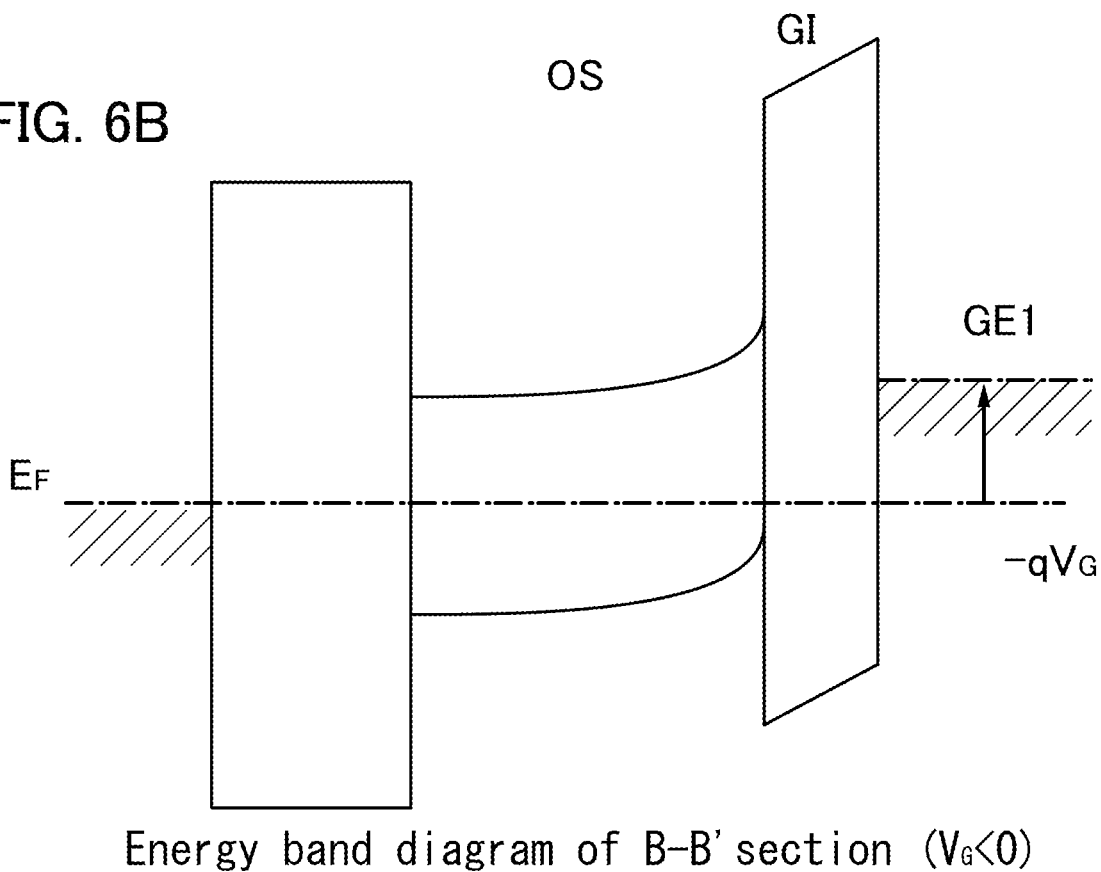

FIGS. 6A and 6B are energy band diagrams (schematic diagrams) of the B-B' section in FIG. 4. FIG. 6A illustrates an on state in which a positive voltage ($V_G>0$) is applied to the gate electrode (GE1) and carriers (electrons) flow between the source electrode and the drain electrode. FIG. 6B illustrates an off state in which a negative voltage ($V_G<0$) is applied to the gate electrode (GE1) and minority carriers do not flow.

Figure 7:
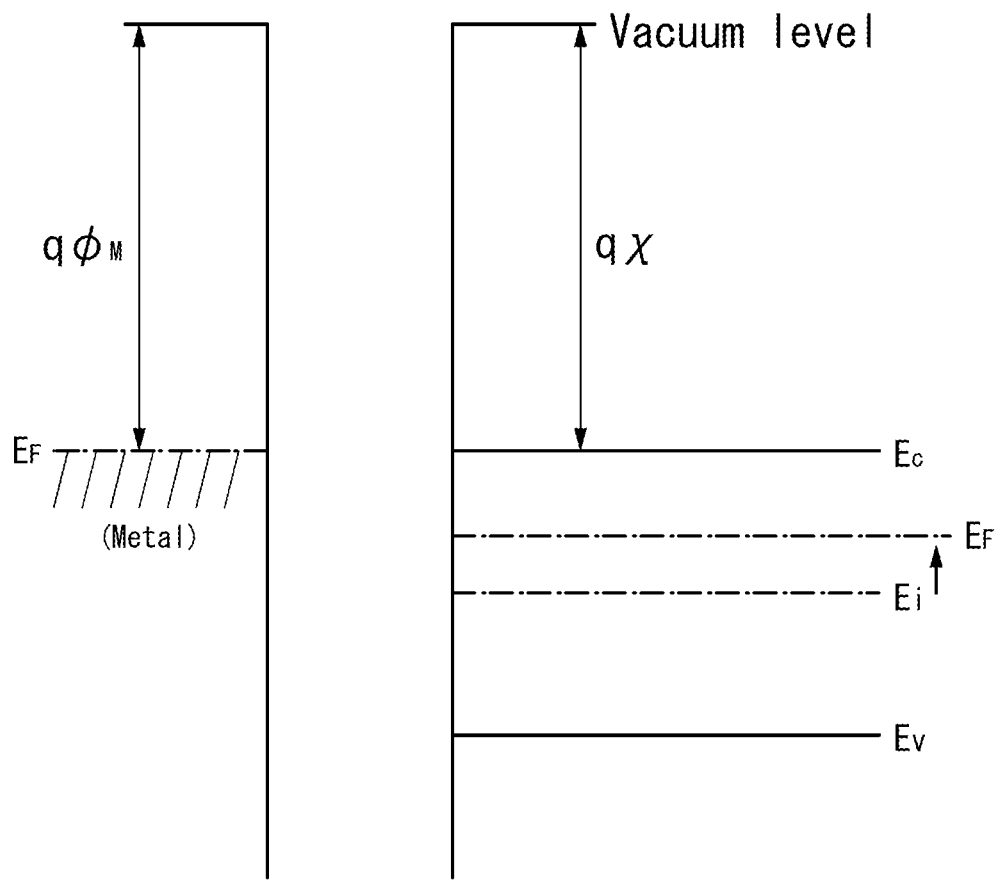
FIG. 7 is a diagram illustrating the relationships between the vacuum level and the work function of a metal (+M) and between the vacuum level and the electron affinity ($\chi$) of an oxide semiconductor.

FIG. 7 illustrates the relationships between the vacuum level and the work function of a metal ($\phi_M$) and between the vacuum level and the electron affinity ($\chi$) of an oxide semiconductor.

At normal temperature, electrons in the metal are degenerated and the Fermi level is located in the conduction band. On the other hand, a conventional oxide semiconductor is an n-type semiconductor, in which the Fermi level ($E_F$) is away from the intrinsic Fermi level ($E_i$) located in the middle of a band gap and is located closer to the conduction band. Note that it is known that part of hydrogen is a donor in an oxide semiconductor and is one factor causing an oxide semiconductor to be an n-type semiconductor.

On the other hand, an oxide semiconductor according to one embodiment of the disclosed invention is an intrinsic (i-type) or a substantially intrinsic oxide semiconductor which is obtained by removing hydrogen that is a factor for an n-type semiconductor from an oxide semiconductor and purifying the oxide semiconductor such that an element other than a main component of the oxide semiconductor (i.e., an impurity element) is prevented from being contained therein as much as possible. In other words, a feature is that a purified i-type (intrinsic) semiconductor, or a semiconductor close thereto, is obtained not by adding an impurity element but by removing an impurity such as hydrogen or water as much as possible. Thus, the Fermi level ($E_F$) can be comparable with the intrinsic Fermi level ($E_i$).

It is said that the band gap ($E_g$) of an oxide semiconductor is 3.15 eV and the electron affinity ($\chi$) is 4.3 V. The work function of titanium (Ti) included in the source electrode and the drain electrode is substantially equal to the electron affinity ($\chi$) of the oxide semiconductor. In that case, a Schottky barrier for electrons is not formed at an interface between the metal and the oxide semiconductor.

At that time, the electron moves in the vicinity of the interface between the gate insulating layer and the purified oxide semiconductor (the lowest portion of the oxide semiconductor which is stable in terms of energy) as illustrated in FIG. 6A.

In addition, as illustrated in FIG. 6B, when a negative potential is applied to the gate electrode (GE1), the value of current is extremely close to zero because holes that are minority carriers are substantially zero.

In such a manner, an intrinsic (i-type) or substantially intrinsic oxide semiconductor is obtained by being purified such that an element other than its main element (i.e., an impurity element) is contained as little as possible. Thus, characteristics of the interface between the oxide semiconductor and the gate insulating layer become obvious. For that reason, the gate insulating layer needs to be able to form a favorable interface with the oxide semiconductor. Specifically, it is preferable to use, for example, an insulating layer formed by a CVD method using high-density plasma generated with a power supply frequency in the range of the VHF band to the microwave band, an insulating layer formed by a sputtering method, or the like.

When the oxide semiconductor is purified and the interface between the oxide semiconductor and the gate insulating layer is made favorable, in the case where the transistor has a channel width (W) of $1\times10^4$ µm and a channel length (L) of 3 µm, for example, it is possible to realize an off-state current of $10^{-13}$ A or less and a subthreshold swing (S value) of 0.1 V/dec (with a 100-nm-thick gate insulating layer).

The oxide semiconductor is purified as described above so as to contain an element other than its main element (i.e., an impurity element) as little as possible, so that the thin film transistor can operate in a favorable manner.

<Resistance of Transistor Including Oxide Semiconductor to Hot Carrier Degradation>

Next, the resistance of a transistor including an oxide semiconductor to hot carrier degradation will be described with reference to FIGS. 8A and 8B, FIGS. 9A and 9B, and FIGS. 10A and 10B. Note that the following description is based on the assumption of an ideal situation for easy understanding and does not necessarily reflect a real situation. Note also that the following description is just a consideration.

Main causes of hot carrier degradation are channel hot electron injection (CHE injection) and drain avalanche hot carrier injection (DAHC injection). Note that only electrons are considered below for simplicity.

CHE injection refers to a phenomenon in which electrons having gained energy higher than the barrier of a gate insulating layer in a semiconductor layer are injected into the gate insulating layer or the like. Electrons gain energy by being accelerated by a low electric field.

DAHC injection refers to a phenomenon in which electrons generated by collision of electrons accelerated by a high electric field are injected to a gate insulating layer or the like. A difference between DAHC injection and CHE injection is whether or not they involve avalanche breakdown caused by impact ionization. Note that DAHC injection requires electrons having a kinetic energy higher than a band gap of a semiconductor.

FIGS. 8A and 8B illustrate energy required for each hot carrier injection which is estimated from the band structure of silicon (Si), and FIGS. 9A and 9B illustrate energy required for each hot carrier injection which is estimated from the band structure of an In—Ga—Zn—O— based oxide semiconductor (IGZO). FIG. 8A and FIG. 9A show CHE injection and FIG. 8B and FIG. 9B show DAHC injection.

Regarding silicon, degradation caused by DAHC injection is more serious than that caused by CHE injection. This results from the fact that carriers (e.g., electrons) which are accelerated without colliding are very few in silicon whereas silicon has a narrow band gap and avalanche breakdown readily occurs therein. The avalanche breakdown increases the number of electrons capable of travelling over the barrier of the gate insulating layer, and the probability of DAHC injection readily becomes higher than that of CHE injection.

Regarding an In—Ga—Zn—O— based oxide semiconductor, the energy required for CHE injection does not greatly differ from that in the case of silicon, and the probability of CHE injection is still low. In addition, the energy required for DAHC injection is substantially equal to the energy required for CHE injection due to a wide band gap.

In other words, the probabilities of both CHE injection and DAHC injection are low and the resistance to hot carrier degradation is higher than that of silicon.

Meanwhile, the band gap of an in-Ga—Zn—O-based oxide semiconductor is comparable to that of silicon carbide (SiC) which attracts attention as a material having a high withstand voltage. FIGS. 10A and 10B illustrate energy required for each hot carrier injection regarding 4H—SiC. FIG. 10A shows CHE injection and FIG. 10B shows DAHC injection. Regarding CHE injection, an In—Ga—Zn—O-based oxide semiconductor has a slightly higher threshold and can be said to have an advantage.

As described above, it can be seen that an In—Ga—Zn—O-based oxide semiconductor has significantly higher resistance to hot carrier degradation and higher resistance to source-drain breakdown than silicon. It can also be said that a withstand voltage comparable to that of silicon carbide can be obtained.

<Short-Channel Effect in Transistor Including Oxide Semiconductor>

Next, a short-channel effect in a transistor including an oxide semiconductor will be described with reference to FIG. 11 and FIG. 12. Note that the following description is based on the assumption of an ideal situation for easy understanding and does not necessarily reflect a real situation. Note also that the following description is just a consideration.

The short-channel effect refers to degradation of electrical characteristics which becomes obvious with miniaturization of a transistor (a reduction in channel length (L)). The short-channel effect results from the effect of a drain on a source. Specific examples of the short-channel effect are a decrease in threshold voltage, an increase in subthreshold swing (S value), an increase in leakage current, and the like.

Here, a structure capable of suppressing a short-channel effect is examined by device simulation. Specifically, four kinds of models each having a different carrier concentration and a different thickness of an oxide semiconductor layer were prepared, and the relationship between a channel length (L) and a threshold voltage ($V_{th}$) was checked. As the models, bottom-gate transistors were employed, in each of which an oxide semiconductor had a carrier concentration of $1.7 \times 10^{-8}$ cm$^3$ or $1.0 \times 10^{15}$/cm$^3$ and an oxide semiconductor layer had a thickness of 1 μm or 30 nm. Note that an In—Ga—Zn—O-based oxide semiconductor was used for the oxide semiconductor layer, and a silicon oxynitride film with a thickness of 100 nm was used as a gate insulating layer. It was assumed that, in the oxide semiconductor, the band gap was 3.15 eV, the electron affinity was 4.3 eV, the relative permittivity was 15, and the electron mobility was 10 cm$^2$/Vs. The relative permittivity of the silicon oxynitride film was assumed to be 4.0. The calculation was performed using device simulation software "ATLAS" produced by Silvaco Inc.

Note that there is no significant difference in calculation results between a top-gate transistor and a bottom-gate transistor.

Figure 11:
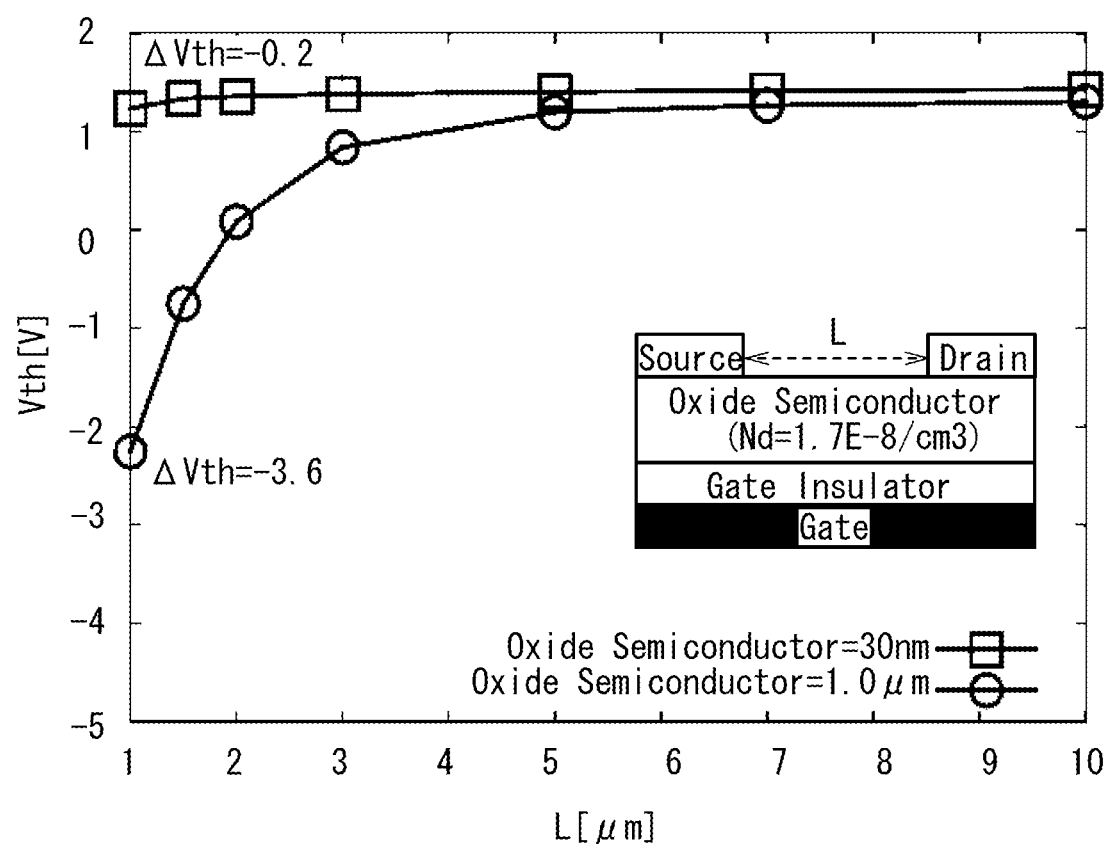
FIG. 11 is a diagram showing the results of device simulation as to short-channel effect.
Figure 12:
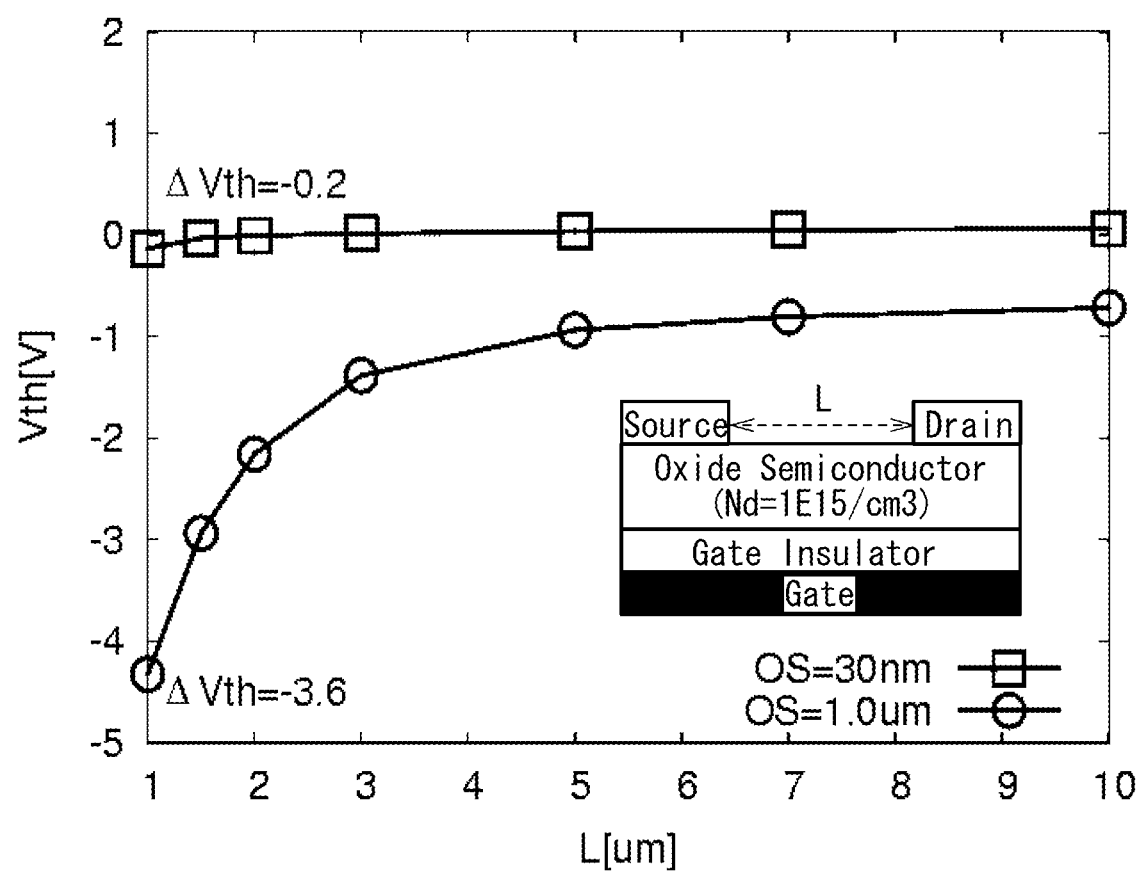
FIG. 12 is a diagram showing the results of device simulation as to short-channel effect.

FIG. 11 and FIG. 12 show calculation results. FIG. 11 shows the case where the carrier concentration is $1.7 \times 10^{-8}$/cm$^3$ and FIG. 12 shows the case where the carrier concentration is $1.0 \times 10^{15}$/cm$^3$. FIG. 11 and FIG. 12 each show the amount of change ($\Delta V_{th}$) in threshold voltage ($V_{th}$) when a transistor whose channel length (L) is 10 μm is used as a reference and channel lengths (L) vary from 10 μm to 1 μm. As shown in FIG. 11, in the case where the carrier concentration in the oxide semiconductor was $1.7 \times 10^{-8}$/cm$^3$ and the thickness of the oxide semiconductor layer was 1 μm, the amount of change ($\Delta V_{th}$) in threshold voltage was −3.6 V. Moreover, as shown in FIG. 11, in the case where the carrier concentration in the oxide semiconductor was $1.7 \times 10^{-8}$/cm$^3$ and the thickness of the oxide semiconductor layer was 30 nm, the amount of change ($\Delta V_{th}$) in threshold voltage was −0.2 V. In addition, as shown in FIG. 12, in the case where the carrier concentration in the oxide semiconductor was $1.0 \times 10^{15}$/cm$^3$ and the thickness of the oxide semiconductor layer was 1 μm, the amount of change ($\Delta V_{th}$) in threshold voltage was −3.6 V. Moreover, as shown in FIG. 12, in the case where the carrier concentration in the oxide semiconductor was $1.0 \times 10^{15}$/cm$^3$ and the thickness of the oxide semiconductor layer was 30 nm, the amount of change ($\Delta V_{th}$) in threshold voltage was −0.2 V. The results show that a short-channel effect can be suppressed in a transistor including an oxide semiconductor by a reduction in thickness of an oxide semiconductor layer. For example, in the case where the channel length (L) is approximately 1 μm, even with an oxide semiconductor layer having sufficiently high carrier concentration, it can be understood that a short-channel effect can be sufficiently suppressed when the thickness of the oxide semiconductor layer is set to approximately 30 nm.

<Carrier Concentration>

A technical idea according to the disclosed invention is to make an oxide semiconductor layer as close as possible to an intrinsic (i-type) oxide semiconductor layer by sufficiently reducing the carrier concentration thereof. A method for calculating the carrier concentration and an actually measured carrier concentration will be described with reference to FIG. 13 and FIG. 14.

First, a method for calculating the carrier concentration is briefly explained. The carrier concentration can be calculated in such a manner that a MOS capacitor is manufactured and the results of C-V measurement (C-V characteristics) of the MOS capacitor are evaluated.

Specifically, carrier concentration Na can be calculated in the following manner: C-V characteristics are obtained by plotting the relationship between the gate voltage $V_G$ and capacitance C of a MOS capacitor; a graph of the relationship between the gate voltage $V_G$, and $(1/C)^2$ is obtained from the C-V characteristics; a differential value of $(1/C)^2$ in a weak inversion region of the graph is found; and the differential value is substituted into Formula 1. Note that e, ε0, and ε in Formula 1 represent elementary electric charge, vacuum permittivity, and relative permittivity of an oxide semiconductor, respectively.

[Formula 1]

$$N_d = -\left(\frac{2}{e\varepsilon_0\varepsilon}\right) / \frac{d(1/C)^2}{dV} \quad (1)$$

Next, carrier concentration actually measured by the above method is described. A sample (a MOS capacitor) used for the measurement was formed as follows: a titanium film was formed to a thickness of 300 nm over a glass substrate; a titanium nitride film was formed to a thickness of 100 nm over the titanium film; an oxide semiconductor layer including an In—Ga—Zn—O-based oxide semiconductor was formed to a thickness of 2 μm over the titanium nitride film; and a silver film was formed to a thickness of 300 nm over the oxide semiconductor layer. Note that the oxide semiconductor layer was formed using a target for depositing an oxide semiconductor including In, Ga, and Zn (In:Ga:Zn=1:1:0.5 [atomic ratio]) by a sputtering method. Further, an atmosphere in which the oxide semiconductor layer was formed was a mixed atmosphere of argon and oxygen (with a flow ratio of Ar:O$_{2=30}$ (sccm): 15 (sccm)).

Figure 13:
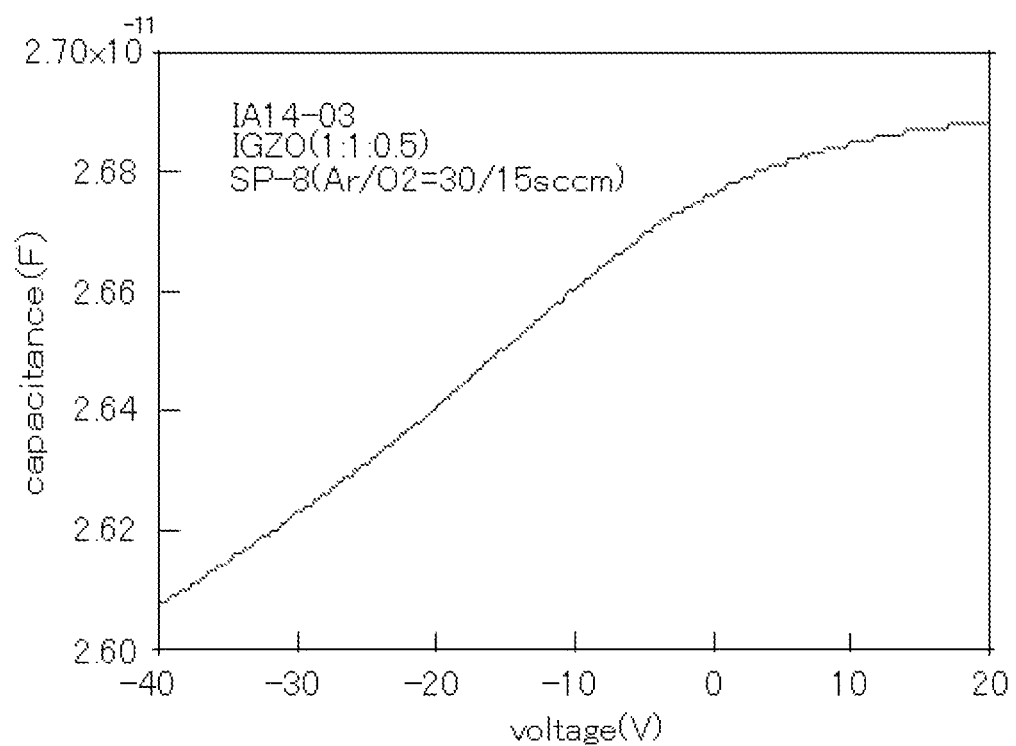
FIG. 13 is a diagram showing C-V characteristics.
Figure 14:
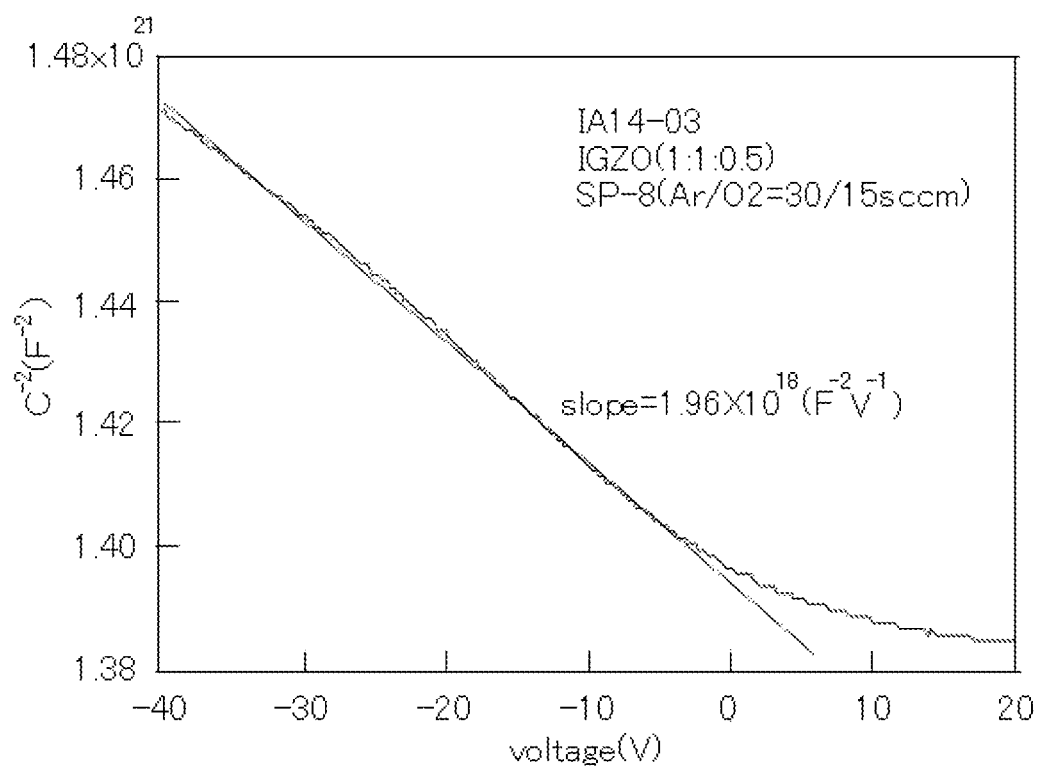
FIG. 14 is a diagram illustrating the relationship between $V_G$ and $(1/CY)^2$.

FIG. 13 and FIG. 14 illustrate the C-V characteristics and the relationship between $V_G$ and $(1/C)^2$, respectively. The carrier concentration calculated using Formula 1 from the differential value of $(1/C)^2$ in a weak inversion region of the graph of FIG. 14 was $6.0\times10^{10}/\text{cm}^3$.

In this manner, by using an i-type or substantially i-type oxide semiconductor (for example, with a carrier concentration of less than $1\times10^{12}/\text{cm}^3$, preferably less than or equal to $1\times10_{11}/\text{cm}^3$), a transistor with excellent off-state current characteristics can be obtained.

The structures, methods, and the like described in this embodiment can be combined as appropriate with any of the structures, methods, and the like described in other embodiments.

Embodiment 2

In this embodiment, examples of electronic devices each including the semiconductor device according to any of the above-described embodiments will be described with reference to FIGS. 15A to 15F. The semiconductor device according to any of the above embodiments has unprecedented excellent characteristics. Therefore, an electronic device with a novel structure can be provided by using the semiconductor device. Note that the semiconductor device according to any of the above embodiments is integrated and mounted on a circuit board or the like, and incorporated in an electronic device.

Figure 15A:
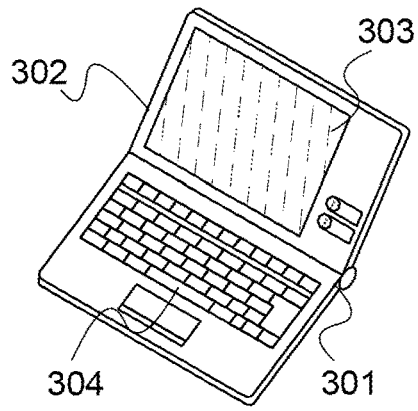
FIGS. 15A to 15F are cross-sectional views each illustrating a semiconductor device.

FIG. 15A illustrates a notebook personal computer including the semiconductor device according to any of the above embodiments, and includes a main body 301, a housing 302, a display portion 303, a keyboard 304, and the like. By applying the semiconductor device according to the disclosed invention to a personal computer, a high-performance personal computer can be provided.

Figure 15B:
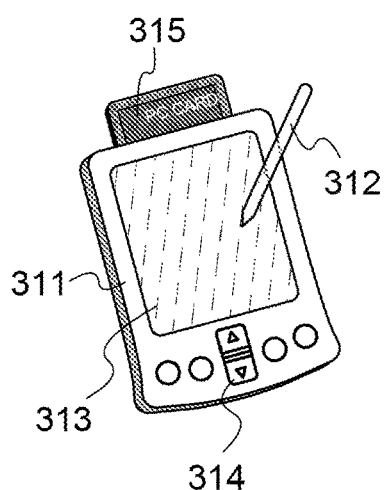

FIG. 15B illustrates a personal digital assistant (PDA) including the semiconductor device according to any of the above embodiments. A main body 311 is provided with a display portion 313, an external interface 315, operation buttons 314, and the like. Further, a stylus 312 is provided as an accessory for operation. By applying the semiconductor device according to the disclosed invention to a personal digital assistant (PDA), a high-performance personal digital assistant (PDA) can be provided.

Figure 15C:
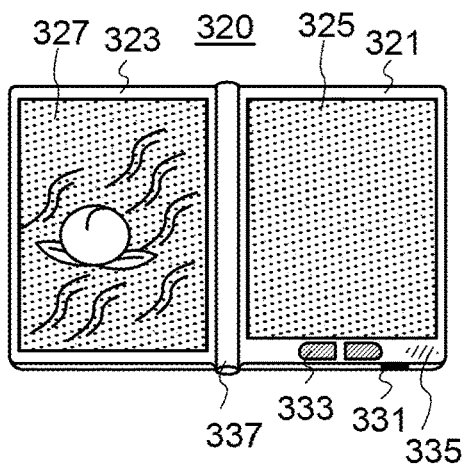

FIG. 15C illustrates an electronic book 320 as an example of electronic paper including the semiconductor device according to any of the above embodiments. The electronic book 320 includes two housings, a housing 321 and a housing 323. The housing 321 is combined with the housing 323 by a hinge 337, so that the electronic book 320 can be opened and closed using the hinge 337 as an axis. With such a structure, the electronic book 320 can be used like a paper book.

The housing 321 includes a display portion 325, and the housing 323 includes a display portion 327. The display portion 325 and the display portion 327 can display a continuous image or different images. A structure for displaying different images enables text to be displayed on the right display portion (the display portion 325 in FIG. 15C) and images to be displayed on the left display portion (the display portion 327 in FIG. 15C).

FIG. 15C illustrates an example in which the housing 321 is provided with an operation portion and the like. For example, the housing 321 is provided with a power switch 331, operation keys 333, a speaker 335, and the like. The operation keys 333 allow pages to be turned. Note that a keyboard, a pointing device, or the like may also be provided on the same side of the housing as the display portion. Furthermore, an external connection terminal (an earphone terminal, a USB terminal, a terminal that can be connected to an AC adapter and various cables such as a USB cable, or the like), a recording medium insertion portion, and the like may be provided on the back surface or the side surface of the housing. The electronic book 320 can also serve as an electronic dictionary.

In addition, the electronic book 320 can send and receive information wirelessly. Through wireless communication, desired book data or the like can be purchased and downloaded from an electronic book server.

Note that electronic paper can be used for electronic devices in all fields as long as they can display data. For example, to display data, electronic paper can be applied to posters, advertisement in vehicles such as trains, a variety of cards such as credit cards, and the like as well as electronic books. By applying the semiconductor device according to the disclosed invention to electronic paper, high-performance electronic paper can be provided.

Figure 15D:
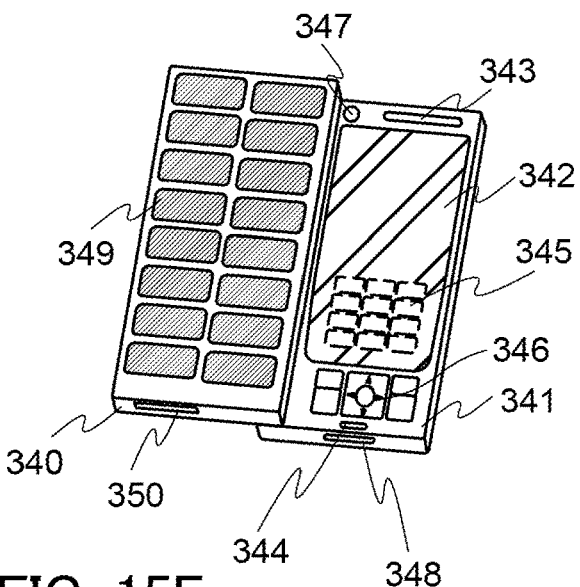

FIG. 15D illustrates a cellular phone including the semiconductor device according to any of the above embodiments. The cellular phone includes two housings, a housing 340 and a housing 341. The housing 341 includes a display panel 342, a speaker 343, a microphone 344, a pointing device 346, a camera lens 347, an external connection terminal 348, and the like. The housing 340 includes a solar cell 349 for charging the cellular phone, an external memory slot 350, and the like. An antenna is incorporated in the housing 341.

The display panel 342 has a touch panel function. A plurality of operation keys 345 displayed as images are indicated by dashed lines in FIG. 15D. Note that the cellular phone includes a booster circuit for increasing a voltage output from the solar cell 349 to a voltage needed for each circuit. It is possible for the cellular phone to have, in addition to the above structure, a structure in which a noncontact IC chip, a small recording device, or the like are formed.

The display panel 342 changes the orientation of display as appropriate in accordance with the application mode. Further, the camera lens 347 is provided on the same side as the display panel 342, so that the cellular phone can be used as a video phone. The speaker 343 and the microphone 344 can be used for videophone calls, recording, and playing sound, etc. as well as voice calls. Moreover, the housings 340 and 341 in a state where they are developed as illustrated in FIG. 15D can be slid so that one is lapped over the other. Therefore, the size of the cellular phone can be reduced, which makes the cellular phone suitable for being carried around.

The external connection terminal 348 can be connected to an AC adapter or a variety of cables such as a USB cable, so that the cellular phone can be charged or can perform data communication. Moreover, the cellular phone can store and transfer a larger amount of data by inserting a recording medium into the external memory slot 350. Further, in addition to the above functions, an infrared communication function, a television reception function, or the like may be provided. By applying the semiconductor device according to the disclosed invention to a cellular phone, a high-performance cellular phone can be provided.

Figure 15E:
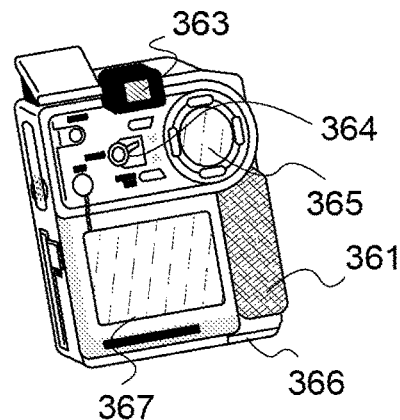

FIG. 15E illustrates a digital camera including the semiconductor device according to any of the above embodiments. The digital camera includes a main body 361, a display portion A 367, an eyepiece 363, an operation switch 364, a display portion B 365, a battery 366, and the like. By applying the semiconductor device according to the disclosed invention to a digital camera, a high-performance digital camera can be provided.

Figure 15F:
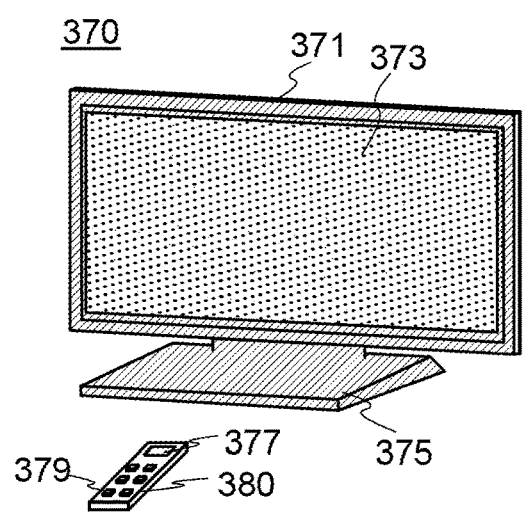

FIG. 15F illustrates a television set including the semiconductor device according to any of the above embodiments. In a television set 370, a display portion 373 is incorporated in a housing 371. Images can be displayed on the display portion 373. Here, the housing 371 is supported by a stand 375.

The television set 370 can be operated with an operation switch included in the housing 371 or by a remote controller 380. Channels and volume can be controlled with a control key 379 included in the remote controller 380, and images displayed on the display portion 373 can thus be controlled. Further, the remote controller 380 can be provided with a display portion 377 for displaying data to be output from the remote controller 380.

Note that the television set 370 preferably includes a receiver, a modem, and the like. The receiver allows the television set 370 to receive a general television broadcast. In addition, the television set 370 is capable of one-way (from a transmitter to a receiver) or two-way (between a transmitter and a receiver, between receivers, or the like) data communication when connected to a communication network by wired or wireless connection via the modem. By applying the semiconductor device according to the disclosed invention to a television set, a high-performance television set can be provided.

The structures, methods, and the like described in this embodiment can be combined as appropriate with any of the structures, methods, and the like described in other embodiments.

EXAMPLE

In this example, oxidation of a conductive layer by high-density plasma treatment according to an embodiment of the disclosed invention is confirmed. The detailed description thereof is given below.

In this example, plasma was generated by excitation of a mixed gas of oxygen and argon at a power supply frequency of 2.45 GHz under a pressure of 500 Pa, and a conductive layer was treated using the plasma. The treatment was performed under three conditions where the lengths of treatment time were 1 minute (60 seconds), 3 minutes (180 seconds), and 10 minutes (600 seconds) to examine the relationship between treatment time and thickness of an oxide region.

Titanium films formed over glass substrates and aluminum films formed over glass substrates were separately prepared as conductive layers. Each of these films was subjected to the above plasma treatment at a substrate temperature of 300° C. or 325° C. In other words, the relationship between treatment time and thickness of an oxide region was examined under four conditions: the titanium film at a substrate temperature of 300° C., the titanium film at a substrate temperature of 325° C., the aluminum film at a substrate temperature of 300° C., and the aluminum film at a substrate temperature of 325° C.

Figure 16:
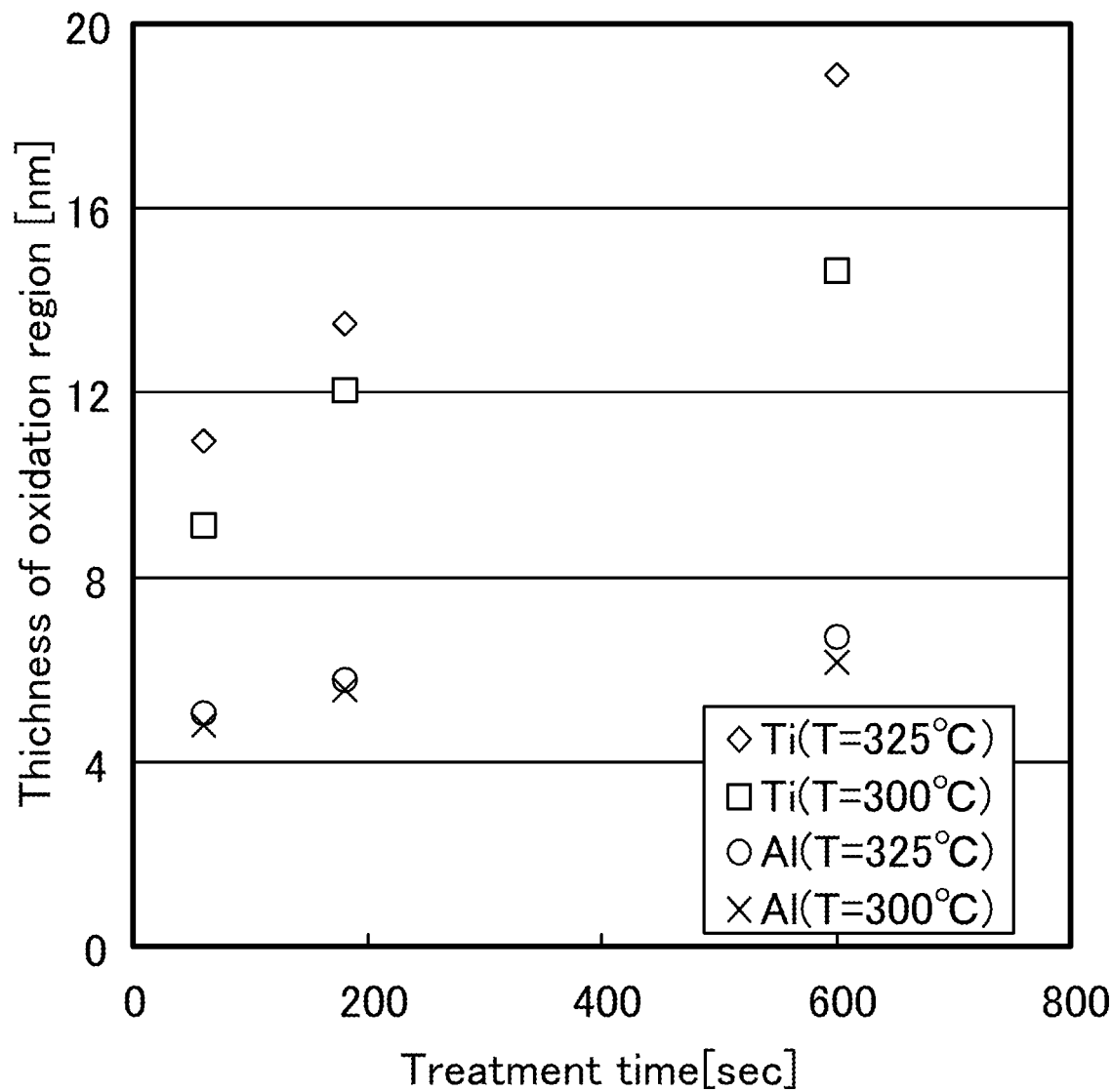
FIG. 16 is a diagram illustrating the relationship between the thickness of an oxide region formed by plasma treatment and the treatment time.

Examination results are shown in FIG. 16. It can be seen from FIG. 16 that the oxidation rate of titanium is higher than that of aluminum. In addition, temperature dependence of the oxidation rate of titanium is large, whereas temperature dependence of the oxidation rate of aluminum is small. Furthermore, it can be said that the thickness of an oxide region of aluminum tends to be saturated in a short time.

Either of the materials can be provided with an oxide region with a thickness (5 nm or more) sufficient to suppress short circuit between a gate electrode and a source or drain electrode.

By performing oxidation treatment with high-density plasma as described in this example, damage to an oxide semiconductor layer can be reduced and localized states due to oxygen deficiency can be reduced, as compared to the case of performing oxidation treatment by normal plasma treatment. In other words, characteristics of an oxide semiconductor layer can be further improved.

In addition, by the above oxidation treatment, an oxide region is formed in part of a source or drain electrode (particularly, a portion corresponding to a side surface thereof); therefore, short circuit between the gate electrode and the source or drain electrode can be prevented.

It can be understood from the above description that an embodiment of the disclosed invention is highly effective in improving reliability and other characteristics of a transistor including an oxide semiconductor.

This application is based on Japanese Patent Application serial no. 2009-260368 filed with Japan Patent Office on Nov. 13, 2009, the entire contents of which are hereby incorporated by reference.

EXPLANATION OF REFERENCE

100: substrate, 102: insulating layer, 104: oxide semiconductor layer, 104a: oxide semiconductor layer, 106: conductive layer, 106a: source or drain electrode. 106b: source or drain electrode, 108: insulating layer, 108a: insulating layer. 108b: insulating layer, 110: oxide region, 112: gate insulating layer, 114: gate electrode, 116: interlayer insulating layer, 118: interlayer insulating layer, 150: transistor, 301: main body, 302: housing, 303: display portion, 304: keyboard, 311: main body, 312: stylus, 313: display portion, 314: operation button, 315: external interface, 320: electronic book, 321: housing, 323: housing, 325: display portion, 327: display portion, 331: power switch, 333: operation key, 335: speaker, 337: axis portion, 340: housing, 341: housing. 342: display panel, 343: speaker, 344: microphone, 345: operation key, 346: pointing device, 347: camera lens, 348: external connection terminal, 349: solar cell, 350: external memory slot, 361: main body, 363: eyepiece, 364: operation switch, 365: display portion B, 366: battery, 367: display portion A, 370: television set, 371: housing, 373: display portion, 375: stand, 377: display portion, 379: operation key, and 380: remote controller.

The invention claimed is:

1. A semiconductor device comprising:
a first insulating layer;
an oxide semiconductor layer over the first insulating layer;
a gate electrode over the oxide semiconductor layer;
a first electrode in contact with an upper surface of the oxide semiconductor layer;
a second insulating layer in contact with the first electrode; and
a third insulating layer over the first electrode,
wherein the oxide semiconductor layer comprises indium, gallium, and zinc,
wherein the second insulating layer, the first electrode, and the oxide semiconductor layer overlap with one another in a direction perpendicular to the upper surface of the oxide semiconductor layer,
wherein the third insulating layer is in contact with the gate electrode, an upper surface and a side surface of the second insulating layer, a side surface of the first electrode, an upper surface of the first insulating layer, and the upper surface of the oxide semiconductor layer, and wherein each of an end portion of the second insulating layer and an end portion of the first electrode has a tapered shape.

2. The semiconductor device according to claim 1, wherein each of the first insulating layer, the second insulating layer, and the third insulating layer comprises silicon oxide.

3. The semiconductor device according to claim 1, wherein the gate electrode is a layered structure including two or more layers and comprises an element selected from aluminum, chromium, copper, tantalum, titanium, molybdenum, and tungsten.

4. The semiconductor device according to claim 1, wherein the first electrode is a layered structure including two or more layers and comprises an element selected from aluminum, chromium, copper, tantalum, titanium, molybdenum, and tungsten.

5. A semiconductor device comprising:
a first insulating layer;
an oxide semiconductor layer over the first insulating layer;
a gate electrode over the oxide semiconductor layer;
a first electrode in contact with an upper surface of the oxide semiconductor layer;
a second insulating layer in contact with the first electrode; and
a third insulating layer over the first electrode, wherein the oxide semiconductor layer comprises indium, gallium, and zinc, wherein the second insulating layer, the first electrode, and the oxide semiconductor layer overlap with one another in a direction perpendicular to the upper surface of the oxide semiconductor layer, wherein the third insulating layer is in contact with the gate electrode, an upper surface and a side surface of the second insulating layer, a side surface of the first electrode, an upper surface of the first insulating layer, and the upper surface of the oxide semiconductor layer, and wherein each of an end portion of the second insulating layer, an end portion of the first electrode, and an end portion of the gate electrode has a tapered shape.

6. The semiconductor device according to claim 5, wherein each of the first insulating layer, the second insulating layer, and the third insulating layer comprises silicon oxide.

7. The semiconductor device according to claim 5, wherein the gate electrode is a layered structure including two or more layers and comprises an element selected from aluminum, chromium, copper, tantalum, titanium, molybdenum, and tungsten.

8. The semiconductor device according to claim 5, wherein the first electrode is a layered structure including two or more layers and comprises an element selected from aluminum, chromium, copper, tantalum, titanium, molybdenum, and tungsten.

* * * * *